(12) United States Patent
Koyama

(10) Patent No.: US 9,286,953 B2
(45) Date of Patent: Mar. 15, 2016

(54) SEMICONDUCTOR DEVICE AND ELECTRONIC DEVICE

(71) Applicant: Semiconductor Energy Laboratory Co., Ltd., Atsugi-shi, Kanagawa-ken (JP)

(72) Inventor: Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/190,244

(22) Filed: Feb. 26, 2014

(65) Prior Publication Data

US 2014/0241054 A1    Aug. 28, 2014

(30) Foreign Application Priority Data

Feb. 28, 2013  (JP) .................................. 2013-038326

(51) Int. Cl.
| | | |
|---|---|---|
| G11C 11/40 | (2006.01) |
| G11C 7/02 | (2006.01) |
| G11C 11/403 | (2006.01) |
| G11C 11/4074 | (2006.01) |
| G11C 11/4096 | (2006.01) |
| H01L 27/06 | (2006.01) |
| H01L 29/786 | (2006.01) |
| H01L 27/12 | (2006.01) |

(52) U.S. Cl.
CPC ............... *G11C 7/02* (2013.01); *G11C 11/403* (2013.01); *G11C 11/4074* (2013.01); *G11C 11/4096* (2013.01); *H01L 27/0688* (2013.01); *H01L 27/1225* (2013.01); *H01L 29/7869* (2013.01); *H01L 29/78696* (2013.01)

(58) Field of Classification Search
CPC ........................................................ G11C 11/40
USPC ............................................. 365/184, 189.09
See application file for complete search history.

(56) References Cited

U.S. PATENT DOCUMENTS

| | | | |
|---|---|---|---|
| 7,176,751 | B2 * | 2/2007 | Giduturi et al. ............... 327/540 |
| 8,339,828 | B2 | 12/2012 | Yamazaki et al. |
| 8,363,452 | B2 | 1/2013 | Yamazaki et al. |
| 8,520,426 | B2 | 8/2013 | Ohnuki |
| 8,542,528 | B2 | 9/2013 | Sekine et al. |
| 8,576,620 | B2 | 11/2013 | Yamazaki et al. |
| 8,614,916 | B2 | 12/2013 | Nagatsuka et al. |
| 2011/0176348 | A1 * | 7/2011 | Yamazaki et al. ............... 365/72 |
| 2012/0032164 | A1 | 2/2012 | Ohnuki |
| 2012/0051118 | A1 * | 3/2012 | Yamazaki et al. ............ 365/149 |

(Continued)

FOREIGN PATENT DOCUMENTS

JP      2011-123986 A     6/2011

*Primary Examiner* — Hoai V Ho
*Assistant Examiner* — Tri Hoang
(74) *Attorney, Agent, or Firm* — Fish & Richardson P.C.

(57) ABSTRACT

To provide a semiconductor device with such a new structure that the effect of variation in transistor characteristics can be reduced to achieve less variation in the output voltage of a memory cell. A memory cell includes a source follower (common drain) transistor for reading data held in a gate. A voltage applied to a transistor generating a reference current flowing through the memory cell is determined so that a gate-source voltage is approximately equal to the threshold voltage of the transistor. With such a structure, data stored in the memory cell can be read as a voltage that is less influenced by variation of transistors such as the field-effect mobility and the size.

19 Claims, 15 Drawing Sheets

(56) References Cited

U.S. PATENT DOCUMENTS

| | | |
|---|---|---|
| 2012/0127781 A1 | 5/2012 | Saito |
| 2012/0153276 A1 | 6/2012 | Kamata |
| 2012/0275245 A1 | 11/2012 | Sekine et al. |
| 2013/0308392 A1 | 11/2013 | Nishijima et al. |

* cited by examiner

SEMICONDUCTOR DEVICE AND ELECTRONIC DEVICE

BACKGROUND OF THE INVENTION

1. Field of the Invention

The present invention relates to a semiconductor device. The present invention also relates to an electronic device including the semiconductor device.

2. Description of the Related Art

Attention has been focused on semiconductor devices including elements with semiconductor properties. An example of the elements with semiconductor properties is a transistor, which is used in a liquid crystal display device, a memory device, and the like.

As a semiconductor material for a transistor, an oxide semiconductor has recently attracted attention though silicon (Si) has been commonly used (see Patent Document 1).

REFERENCE

Patent Document

[Patent Document 1] Japanese Published Patent Application No. 2011-123986

SUMMARY OF THE INVENTION

A semiconductor device disclosed in Patent Document 1 has a structure for storing multilevel data. An increase in the number of bits to increase the amount of data to be stored is essential for a smaller, lighter, and lower power consumption semiconductor device.

However, in the semiconductor device disclosed in Patent Document 1, a transistor for reading data held in a gate is a common source transistor, and data stored in a memory cell is converted into current and then converted into voltage to be output. In such a structure, the output voltage of the memory cell might significantly vary because of variation in characteristics such as the field-effect mobility of the transistor or the transistor size. Therefore, a reference voltage used for measuring the output voltage of the memory cell needs to have a sufficiently wide range, which inhibits the increase in the number of bits.

In view of the above, an object of one embodiment of the present invention is to provide a semiconductor device with such a new structure that the effect of variation in transistor characteristics can be reduced to achieve less variation in the output voltage of a memory cell.

In one embodiment of the present invention, a memory cell includes a source follower (common drain) transistor for reading data held in a gate. A voltage applied to a transistor generating a reference current flowing through the memory cell is determined so that a gate-source voltage is approximately equal to the threshold voltage of the transistor. With such a structure, data stored in the memory cell can be read as a voltage that is less influenced by variation of transistors such as the field-effect mobility and the size.

One embodiment of the present invention is a semiconductor device including a memory cell including a first transistor for writing data and a second transistor which holds the data in a gate and reads the data in accordance with the potential of the gate; and a reference current generation circuit including a third transistor for determining a current flowing between a source and a drain of the second transistor. The second transistor is a common drain transistor.

One embodiment of the present invention is a semiconductor device including a memory cell including a first transistor for writing data and a second transistor which holds the data in a gate and reads the data in accordance with the potential of the gate; and a reference current generation circuit including a third transistor for determining a current flowing between a source and a drain of the second transistor. The second transistor is a common drain transistor. The reference current generation circuit determines a voltage applied between a gate and a source of the third transistor so as to be approximately equal to the threshold voltage of the third transistor, thereby determining the current.

One embodiment of the present invention is a semiconductor device including a memory cell including a first transistor for writing data, a second transistor which holds the data in a gate and reads the data in accordance with the potential of the gate, and a capacitor electrically connected to the gate of the second transistor; and a reference current generation circuit including a third transistor for determining a current flowing between a source and a drain of the second transistor. The second transistor is a common drain transistor. The reference current generation circuit determines a voltage applied between a gate and a source of the third transistor so as to be approximately equal to the threshold voltage of the third transistor, thereby determining the current.

In one embodiment of the present invention, the memory cell in the semiconductor device preferably includes a fourth transistor supplied with a signal for reading data.

In one embodiment of the present invention, the capacitor in the semiconductor device is preferably supplied with a signal for controlling reading of data.

In one embodiment of the present invention, the memory cells are preferably provided in a matrix in the semiconductor device.

In one embodiment of the present invention, a semiconductor layer of the first transistor in the semiconductor device preferably includes an oxide semiconductor.

One embodiment of the present invention provides a semiconductor device with such a novel structure that the effect of variation in the characteristics of transistors can be reduced to reduce variation in the output voltages from memory cells. As a result, one embodiment of the present invention leads to an increase in the number of bits of data stored in a memory cell, resulting in a reduction in the size, weight, or power consumption of the semiconductor device.

DETAILED DESCRIPTION OF THE INVENTION

Figure 1:
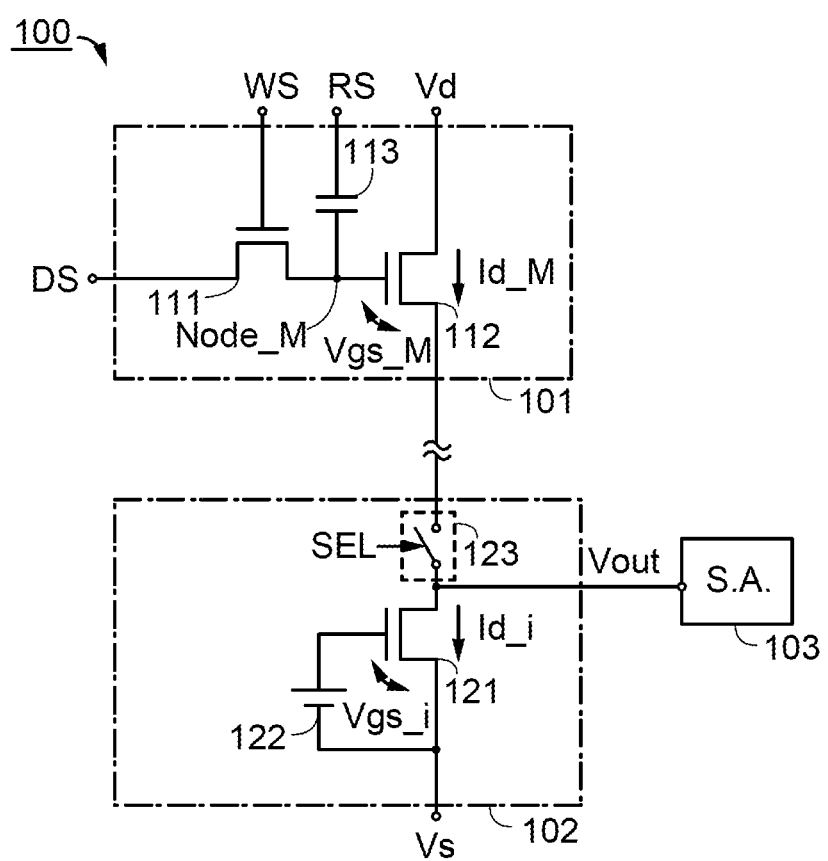
FIG. 1 is a circuit block diagram of a semiconductor device.

Embodiments will be described below with reference to the drawings. Note that the embodiments can be implemented in various different ways and it will be readily appreciated by those skilled in the art that modes and details of the embodiments can be changed in various ways without departing from the spirit and scope of the present invention. The present invention therefore should not be construed as being limited to the following description of the embodiments. Note that in the structures of the present invention described below, reference numerals denoting the same portions are used in common in different drawings.

In the drawings, the size, the layer thickness, or the region is exaggerated for clarity in some cases. Thus, the embodiments of the present invention are not limited to such scales. Note that the drawings are schematic views showing ideal examples, and the embodiments of the present invention are not limited to shapes or values shown in the drawings. For example, the following can be included: variation in signal, voltage, or current due to noise or difference in timing.

In this specification and the like, a transistor is an element having at least three terminals: a gate, a drain, and a source. The transistor includes a channel region between the drain (a drain terminal, a drain region, or a drain electrode) and the source (a source terminal, a source region, or a source electrode) and current can flow through the drain, the channel region, and the source.

Here, since the source and the drain of the transistor change depending on the structure, the operating condition, and the like of the transistor, it is difficult to define which is a source or a drain. Thus, a portion that functions as a source or a portion that functions as a drain is not referred to as a source or a drain in some cases. In that case, one of the source and the drain might be referred to as a first electrode, and the other of the source and the drain might be referred to as a second electrode.

Note that in this specification, ordinal numbers such as "first", "second", and "third" are used in order to avoid confusion among components, and thus do not limit the number of the components.

Note that in this specification, the expression "A and B are connected" means the case where "A and B are electrically connected" in addition to the case where "A and B are directly connected". Here, the expression "A and B are electrically connected" means the case where electric signals can be transmitted and received between A and B when an object having any electric action exists between A and B.

Note that in this specification, terms for describing arrangement, such as "over" and "under", are used for convenience for describing the positional relationship between components with reference to drawings. Further, the positional relationship between components is changed as appropriate in accordance with a direction in which each component is described. Thus, the positional relationship is not limited to that described with a term used in this specification and can be explained with another term as appropriate depending on the situation.

Note that the layout of circuit blocks in a drawing specifies the positional relationship for description. Thus, even when a drawing shows that different functions are achieved in different circuit blocks, an actual circuit or region may be configured so that the different functions are achieved in the same circuit or region. Further, the function of each circuit block in a drawing is specified for description. Thus, even when one circuit block is illustrated, an actual circuit or region may be configured so that processing which is illustrated as being performed in the one circuit block is performed in a plurality of circuit blocks.

Note that a voltage refers to a potential difference between a given potential and a reference potential (e.g., a ground potential) in many cases. Therefore, a voltage, a potential, and a potential difference can also be referred to as a potential, a voltage, and a voltage difference, respectively. Note that a voltage refers to a difference between potentials of two points, and a potential refers to electrostatic energy (electric potential energy) of a unit electric charge at a given point in an electrostatic field.

In this specification, embodiments of the present invention will be described with reference to the drawings. Embodiments are described in the following order:
1. Embodiment 1 (Basic structure relating to one embodiment of the present invention)
2. Embodiment 2 (Structure examples of a sense amplifier and a reference voltage generation circuit)
3. Embodiment 3 (Structure examples of a peripheral circuit and operation of a semiconductor device)
4. Embodiment 4 (Modified examples of a semiconductor device)
5. Embodiment 5 (Oxide semiconductor)
6. Embodiment 6 (Elements included in a semiconductor device)
7. Embodiment 7 (Application examples of a semiconductor device to electronic components and to electronic devices including the electronic components)

Embodiment 1

In this embodiment, a basic structure of a semiconductor device of one embodiment of the disclosed invention will be described with reference to FIG. 1.

FIG. 1 is a circuit block diagram illustrating an example of a semiconductor device 100.

Note that a semiconductor device refers to a device including a semiconductor element. The semiconductor device includes a driver circuit or the like for driving a circuit including a semiconductor element. The semiconductor device may also include a control circuit, a power supply circuit, or the like formed over another substrate.

The circuit block diagram of the semiconductor device 100 illustrated in FIG. 1 includes a memory cell 101 and a reference current generation circuit 102. FIG. 1 also illustrates a sense amplifier 103 (abbreviated to as S.A. in the drawing) which is supplied with an output voltage Vout obtained using the memory cell 101 and the reference current generation circuit 102.

The memory cell 101 illustrated in FIG. 1 includes a transistor 111, a transistor 112, and a capacitor 113. The plurality of memory cells 101 are actually provided in a matrix, though not illustrated in FIG. 1.

The elements in the memory cell 101 will be described below.

A word signal WS is applied to a gate of the transistor 111, and multilevel data DS is supplied to one of a source and a drain of the transistor 111. When the transistor 111 is on, the multilevel data DS is input to one electrode of the capacitor 113 connected to the other of the source and the drain of the transistor 111. The multilevel data DS that has been input to the one electrode of the capacitor 113 is retained even when the transistor 111 is turned off. The transistor 111 is turned on or off depending on the word signal WS. Note that the transistor 111 is also referred to as a first transistor. The transistor 111 is an n-channel transistor.

In the following description, a node Node_M is any node on a wiring that makes a connection among the one electrode of the capacitor 113, the other of the source and the drain of the transistor 111, and a gate of the transistor 112 as illustrated in FIG. 1.

The multilevel data DS is k-bit data (k is a natural number of 2 or more). Specifically, 3-bit data is 8-level data, namely, a signal having any one of 8-level potentials.

The word signal WS controls on/off of the transistor 111 so that data is retained (written) in the node Node_M in the selected memory cell.

Note that in this specification, the expression "a transistor is on" means that a gate-source voltage of the transistor is higher than or equal to the threshold voltage of the transistor. The expression "a transistor is off" means that a gate-source voltage of the transistor is lower than the threshold voltage of the transistor.

A node in this specification refers to a connection point on a wiring that makes electrical connection between elements.

The potential of the node Node_M is supplied to the gate of the transistor 112, and a high power source potential Vd is supplied to one of a source and a drain of the transistor 112. The other of the source and the drain of the transistor 112 is connected to the reference current generation circuit 102. Note that the transistor 112 is also referred to as a second transistor. The transistor 112 is an n-channel transistor.

The potential of the node Node_M is based on the multilevel data DS. Note that in the structure of FIG. 1, the potential of a read signal RS is changed to select a memory cell from which data is to be read. Accordingly, the potential of the node Node_M is the sum of the potential based on the multilevel data DS and the potential of the read signal RS. This change in potential is caused by capacitive coupling which occurs with a change in the read signal RS input to the other electrode of the capacitor 113 when the node Node_M is in an electrically floating state.

Note that in this specification, an electrically floating state refers to the state where an element is electrically isolated and is not electrically connected to another element or a wiring. When a node is in an electrically floating state, for example, electric charge hardly enters or leaves the node, so that the potential is raised or lowered by capacitive coupling of a capacitance component formed at the node.

The transistor 111 preferably has low leakage current (off-state current) in a non-conduction state. Here, low off-state current means that normalized off-state current per micrometer of a channel width at room temperature is lower than or equal to 10 zA/µm. Since the off-state current is preferably as low as possible, the normalized off-state current is preferably lower than or equal to 1 zA/µm, more preferably lower than or equal to 10 yA/µm, and still more preferably lower than or equal to 1 yA/µm. Note that a voltage between a source and a drain in that case is, for example, approximately 0.1 V, 5 V, or 10 V. An example of the transistor having such low off-state current is a transistor including an oxide semiconductor in a channel.

In the memory cell 101 illustrated in FIG. 1, multilevel data is written and retained by the control of on/off of the transistor 111. Hence, it is particularly preferable that the transistor 111 have low off-state current to be used as a switch for controlling variation in the potential of the node Node_M during a data retention period.

When the transistor 111 has low off-state current, the memory cell 101 can be a nonvolatile memory that retains data after power supply is stopped. Accordingly, once data is written to the memory cell 101, the data can be retained in the node Node_M until the transistor 111 is turned on again.

The transistor 112 preferably has little variation in threshold voltage. Here, transistors with little variation in threshold voltage mean as follows: transistors produced in the same process have an acceptable difference in threshold voltage of 20 mV or lower, examples of which are transistors including single crystal silicon in channels. It is needless to say that the variation in threshold voltage is preferably as little as possible; however, even the transistors including single crystal silicon may have a difference in threshold voltage of approximately 20 mV.

In FIG. 1, Id_M denotes a current flowing between the source and the drain of the transistor 112, and Vgs_M denotes a voltage applied between the gate and the source of the transistor 112.

The potential of the node Node_M is supplied to the one electrode of the capacitor 113, and the read signal RS is input to the other electrode of the capacitor 113.

The read signal RS is controlled for selectively reading a signal from a memory cell including the data that is to be read. Specifically, in the case where data is read from a memory cell selectively, the potential of the read signal RS is raised and the potential of the node Node_M is raised accordingly by capacitive coupling.

The above is the description of the elements in the memory cell 101.

Next, the reference current generation circuit 102 in FIG. 1 will be described. The reference current generation circuit 102 illustrated in FIG. 1 includes a transistor 121, a voltage source 122, and a switch 123.

The potential of the voltage source 122 is supplied to a gate of the transistor 121, and the potential of the other of the source and the drain of the transistor 112 is supplied to one of a source and a drain of the transistor 121 through the switch 123. A low power source potential Vs is supplied to the other of the source and the drain of the transistor 121. Note that the transistor 121 is also referred to as a third transistor. The transistor 121 has the same conductivity as the transistor 112, which is an n-channel transistor.

The voltage source 122 is provided to apply voltage between the gate and the source of the transistor 121. The voltage applied from the voltage source 122 is set to be equal to the threshold voltage of the transistor 121 when a voltage corresponding to data is read from the memory cell.

In FIG. 1, Id_i denotes a current flowing between the source and the drain of the transistor 121, and Vgs_i denotes a voltage applied between the gate and the source of the transistor 121, namely, a voltage from the voltage source 122.

The switch 123 is provided between the transistor 121 and the other of the source and the drain of each transistor 112 in the memory cells in the same column. The switch 123 may be formed using a transistor, and is turned on or off by a selection signal SEL, whereby the output voltage Vout is supplied to the sense amplifier 103.

The above is the description of the elements in the reference current generation circuit 102.

The sense amplifier 103 illustrated in FIG. 1 may include an operational amplifier, for example. The output voltage Vout is supplied to a non-inversion input terminal of the operational amplifier, and a reference voltage for determining the output voltage Vout is supplied to an inversion input terminal. The sense amplifier 103 can determine the multilevel data stored in the memory cell 101 in accordance with the relationship between the output voltage Vout and the reference voltage.

Next, description will be made on the operation of the semiconductor device 100 illustrated in FIG. 1 and the effect of the structure of this embodiment.

The transistor 121 in the reference current generation circuit 102 in the circuit structure of FIG. 1 operates in the saturation region. Thus, the current Id_i flowing through the transistor 121 can be approximately represented by Formula (1).

$$Id\_i = \frac{1}{2} \cdot \mu\_i \cdot Cox\_i \cdot \frac{W\_i}{L\_i} \cdot (Vgs\_i - Vth\_i)^2 \tag{1}$$

In Formula (1), $\mu\_i$ is the field-effect mobility of the transistor 121; Cox_i is the electrostatic capacitance of a gate insulating film per unit area; W_i is the channel width of the transistor 121; L_i is the channel length of the transistor 121; and Vth_i is the threshold voltage of the transistor 121.

The transistor 112 in the memory cell 101 in the circuit structure of FIG. 1 operates in the saturation region. Thus, the current Id_M flowing through the transistor 112 can be approximately represented by Formula (2).

$$Id\_M = \frac{1}{2} \cdot \mu\_M \cdot Cox\_M \cdot \frac{W\_M}{L\_M} \cdot (Vgs\_M - Vth\_M)^2 \tag{2}$$

In Formula (2), $\mu\_M$ is the field-effect mobility of the transistor 112; Cox_M is the electrostatic capacitance of a gate insulating film per unit area; W_M is the channel width of the transistor 112; L_M is the channel length of the transistor 112; and Vth_M is the threshold voltage of the transistor 112.

In the circuit structure illustrated in FIG. 1, the current Id_i and the current Id_M are equal to each other when the switch 123 is on. Therefore, Vgs_M can be represented by Formula (3), given that Id_i=Id_M is satisfied in the above formulae.

$$Vgs\_M = \sqrt{A}(Vgs\_i - Vth\_i) + Vth\_M \tag{3}$$

In Formula (3), A in the first term of the right side can be represented by Formula (4).

$$A = \frac{\mu\_i}{\mu\_M} \cdot \frac{Cox\_i}{Cox\_M} \cdot \frac{W\_i}{W\_M} \cdot \frac{L\_M}{L\_i} \tag{4}$$

The first term of the right side of Formula (3) including A has some variables which are likely to vary, such as the field-effect mobility and the size of transistors. That is, Formula (3) indicates that Vgs_M has less variation as the first term of the right side including A becomes smaller.

In order that the first term of the right side including A in Formula (3) is smaller, specifically, the voltage applied from the voltage source 122 may be determined so that Vgs_i−Vth_i is made as small as possible, namely, Vgs_i≈Vth_i is satisfied.

The above relation Vgs_i≈Vth_i means that Vgs_i, the voltage applied from the voltage source 122 between the gate and the source of the transistor 121, is approximately equal to Vth_i, the threshold voltage of the transistor 121. Note that when the voltage Vgs_i is equal to or lower than the threshold voltage Vth_i, almost no current might flow through the transistor 121. Therefore, the state where "the voltage Vgs_i is approximately equal to the threshold voltage Vth_i of the transistor 121" is as follows: the voltage Vgs_i is slightly higher than the threshold voltage Vth_i by several millivolts to several tens of millivolts so that a small amount of current flows through the transistor 121, and/or the voltage Vgs_i is applied so that a current of several microamperes flows through the transistor 121. Even in this state, the aforementioned first term of the right side including A in Formula (3) can be made sufficiently small; thus, an effect similar to that of one embodiment of the present invention can be obtained.

In the above case, Vgs_M can be close to Vth_M. It is preferable that Vgs_i be equal to Vth_i; however, Vgs_i=Vth_i is not satisfied actually because the transistor 121 has a difference in threshold voltage of approximately 20 mV. Hence, Vgs_M is slightly influenced by voltage Va which is produced in the first term of the right side including A in Formula (3), and can be represented as Vth_M+Va.

A change in potentials during operation will be specifically described. For example, multilevel data is written to the memory cell 101 so that the node Node_M has a potential of V(DS). In the case where this data is read from the memory cell 101, the potential of the read signal RS is raised for reading. The potential of the read signal RS is increased only by V(RS), and the potential of the node Node_M is raised accordingly by capacitive coupling of the capacitor 113 to be V(DS)+V(RS).

As described above, the voltage applied between the gate and the source of the transistor 112 is Vth_M+Va from Formula (3). Thus, when the node Node_M, or the gate of the transistor 112 has a potential of V(DS)+V(RS), the source of the transistor 112 is V(DS)+V(RS)−(Vth_M+Va). The potential of the source of the transistor 112 turns on the switch 123, whereby the output voltage Vout represented by Formula (5) is supplied to the sense amplifier 103.

$$Vout = V(DS) + V(RS) - (Vth\_M + Va) \tag{5}$$

Although the output voltage Vout in Formula (5) includes the voltage Va produced depending on variation in the threshold voltage of the transistor 121, the voltage Va is reduced because Vgs_i≈Vth_i is satisfied as described above; thus, the effect of the variation is reduced. The output voltage Vout is output as a potential corresponding to V(DS), the potential of the multilevel data.

Figure 2:
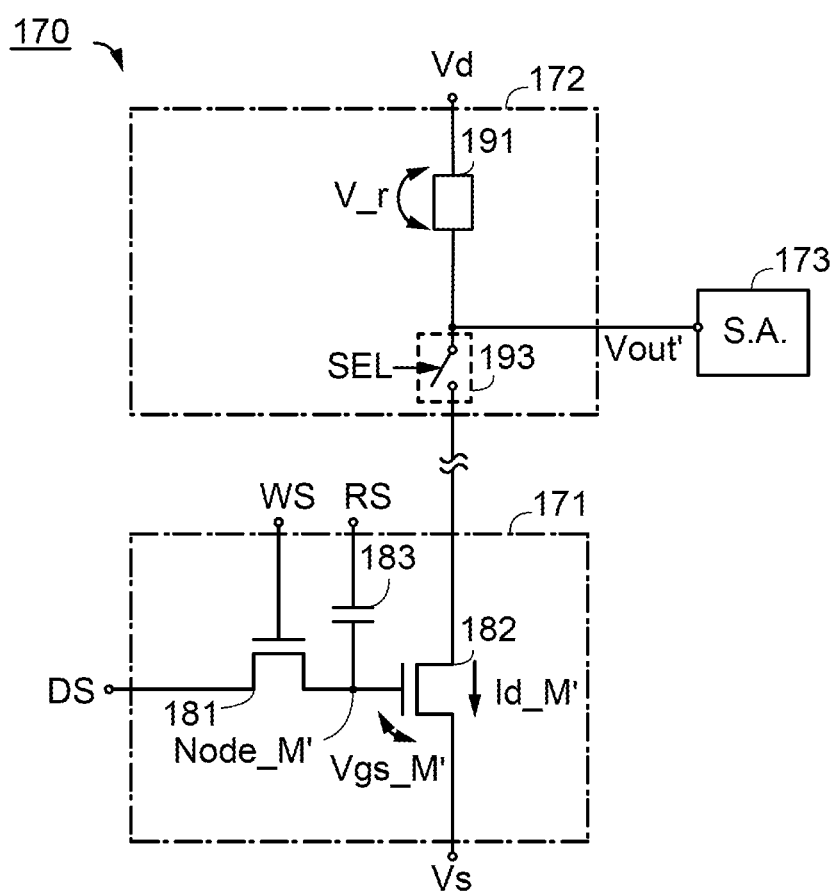
FIG. 2 is a circuit block diagram of a semiconductor device.

For comparison, a circuit block diagram of FIG. 2 illustrates a semiconductor device 170 including a memory cell 171, a current-voltage converter circuit 172, and a sense amplifier 173.

The memory cell 171 illustrated in FIG. 2 includes a transistor 181, a transistor 182, and a capacitor 183.

The elements in the memory cell 171 will be described below. Note that the description of the symbols and signals identical to those in the memory cell 101 in FIG. 1 is omitted and the description in FIG. 1 is referred to.

A word signal WS is applied to a gate of the transistor 181, and multilevel data DS is supplied to one of a source and a drain of the transistor 181. In the following description, a node Node_M' is any node on a wiring that makes a connection among one electrode of the capacitor 183, the other of the source and the drain of the transistor 181, and a gate of the transistor 182 as illustrated in FIG. 2.

The potential of the node Node_M' is supplied to the gate of the transistor 182, and a low power source potential Vs is supplied to one of a source and a drain of the transistor 182. The other of the source and the drain of the transistor 182 is connected to the current-voltage converter circuit 172.

In FIG. 2, Id_M' denotes a current flowing between the source and the drain of the transistor 182, and Vgs_M' denotes a voltage applied between the gate and the source of the transistor 182.

The potential of the node Node_M' is supplied to the one electrode of the capacitor 183.

The above is the description of the elements in the memory cell 171.

Next, the current-voltage converter circuit 172 illustrated in FIG. 2 will be described. The current-voltage converter circuit 172 in FIG. 2 includes a load 191 and a switch 193. Note that the description of the symbols and signals identical to those in the reference current generation circuit 102 in FIG. 1 is omitted and the description in FIG. 1 is referred to. The description of the switch 193 is also omitted and the description of the switch 123 in FIG. 1 is referred to.

The load 191 is a resistor, for example. A high power source potential Vd is supplied to one terminal of the load 191, and the potential of the other of the source and the drain of the transistor 182 is supplied to the other terminal of the load 191 through the switch 193. When the switch 193 is on, the potential of the other of the source and the drain of the transistor 182 is output as an output voltage Vout'.

The above is the description of the elements in the current-voltage converter circuit 172.

The sense amplifier 173 in FIG. 2 is identical to the sense amplifier 103 in FIG. 1.

Next, the operation of the semiconductor device 170 in FIG. 2 will be described and compared with that of the structure in FIG. 1.

The transistor 182 in the memory cell 171 in the circuit structure of FIG. 2 operates in the saturation region. Thus, the current Id_M' flowing through the transistor 182 can be approximately represented by Formula (6).

$$\mathrm{Id\_M'} = \frac{1}{2} \cdot \mu\_M' \cdot \mathrm{Cox\_M'} \cdot \frac{\mathrm{W\_M'}}{\mathrm{L\_M'}} \cdot (\mathrm{Vgs\_M'} - \mathrm{Vth\_M'})^2 \quad (6)$$

In Formula (6), μ_M' is the field-effect mobility of the transistor 182; Cox_M' is the electrostatic capacitance of a gate insulating film per unit area; W_M' is the channel width of the transistor 182; L_M' is the channel length of the transistor 182; and Vth_M' is the threshold voltage of the transistor 182.

In Formula (6), the current Id_M' flowing through the transistor 182 changes depending on the voltage Vgs_M', which is determined by the potential of the multilevel data written to the node Node_M' of the memory cell 171. The current Id_M' flowing through the transistor 182 is obtained by multiplication of some variables which are likely to vary, such as the field-effect mobility and the size of transistors. Therefore, the current Id_M' largely charges because of variation in the characteristics of the transistor.

In the circuit structure illustrated in FIG. 2, when the current Id_M' represented by Formula (6) flows through the load 191, a voltage V_r represented by Formula (7) is applied between the terminals of the load 191.

$$V\_r = Id\_M' \cdot R \quad (7)$$

In Formula (7), resistance R is the resistance of the load 191. In the case where the load 191 is formed using semiconductor elements such as transistors, the resistance R is likely to change depending on variation in the characteristics of the transistors or manufacturing conditions of the semiconductor elements. This variation causes a significant change in the voltage V_r.

The output voltage Vout', which is represented by Formula (8) using the voltage V_r determined by the current Id_M', is supplied to the sense amplifier 173.

$$Vout' = Vd - V\_r \quad (8)$$

The second term of the right side of Formula (8) includes V_r represented by Formula (7). The voltage V_r is obtained by multiplication of the current Id_M' represented by Formula (6) and the resistance R that is a variable being likely to vary as described in Formula (7). Hence, the output voltage Vout' in Formula (8) is output with increased variation.

In the comparative example described using Formulae (6) to (8), the transistor for reading data from the memory cell is a common source transistor as illustrated in FIG. 2. In such a structure, a voltage applied between the gate and the source of the transistor 182 in the memory cell 171 is converted into a current, and the current is converted into a voltage by the load 191 in the current-voltage converter circuit 172. As a result, the output voltage Vout' is obtained with increased variation as described above.

On the contrary, in the structure of this embodiment described using Formulae (1) to (5), the transistor for reading data from the memory cell is a source follower, namely, a common drain transistor as illustrated in FIG. 1. In that structure, the potential held in the node Node_M in the memory cell 101 can be output as a voltage value applied between the gate and the source of the transistor 112 in the memory cell 101. Therefore, the output voltage Vout has a value that is less influenced by the aforementioned variables causing variation.

In the structure of this embodiment, a voltage corresponding to data that is less influenced by variation in the characteristics of transistors can be read as an output voltage from a memory cell. As a result, multilevel data to be written to the memory cell can have a larger number of bits.

The structure described in this embodiment can be combined as appropriate with any of the structures described in the other embodiments.

Embodiment 2

In this embodiment, structure examples of the sense amplifier shown in Embodiment 1 and a reference voltage generation circuit for generating a reference voltage supplied to the sense amplifier, will be described with reference to FIG. 3 and FIGS. 4A and 4B.

Figure 3:
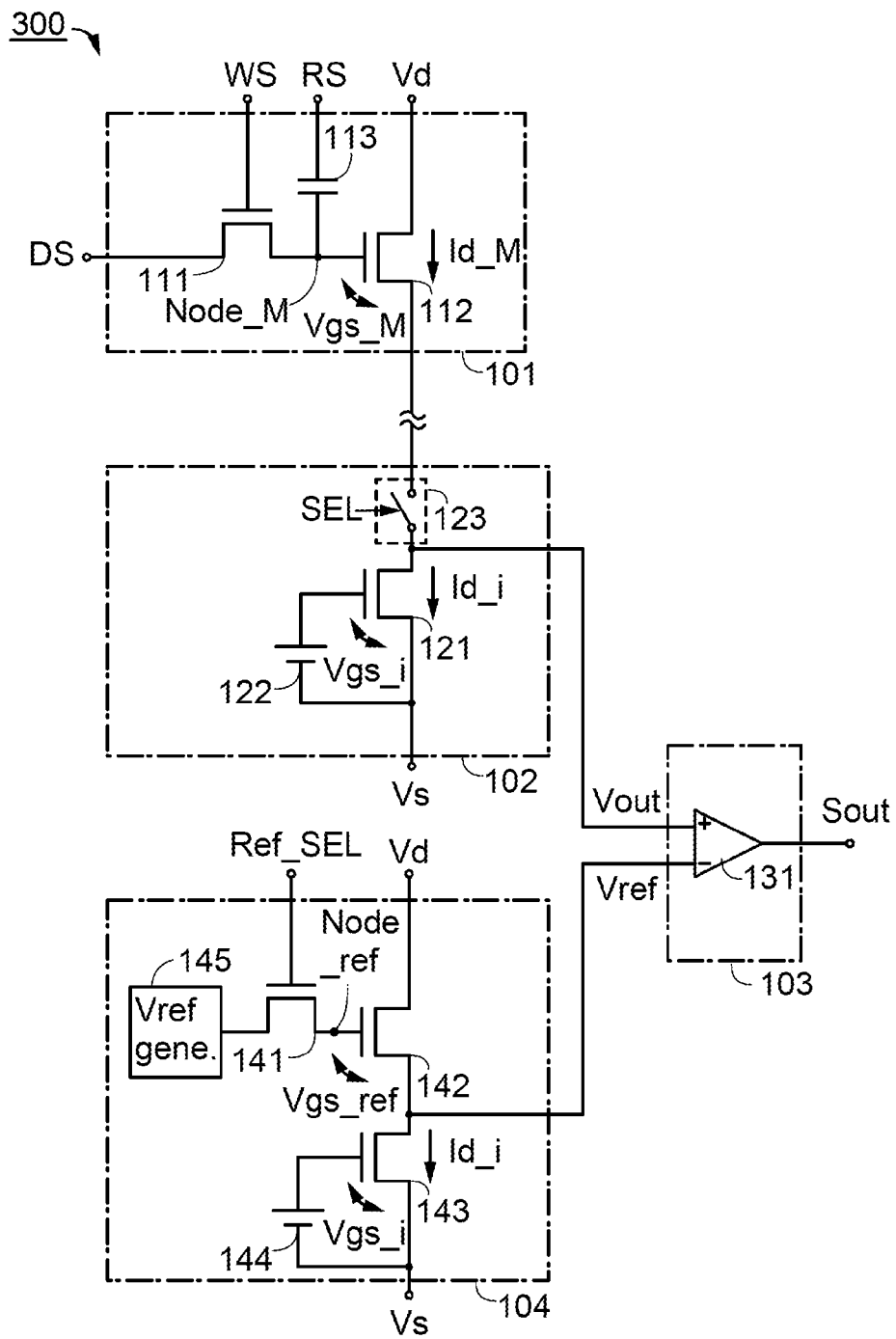
FIG. 3 is a circuit block diagram of a semiconductor device.

FIG. 3 is a circuit block diagram of a semiconductor device 300 including a reference voltage generation circuit 104 in addition to the memory cell 101, the reference current generation circuit 102, and the sense amplifier 103 which are illustrated in FIG. 1.

The memory cell 101 and the reference current generation circuit 102 in FIG. 3 each have a structure similar to that in FIG. 1; thus, the description of the same symbols and signals is omitted and the description of FIG. 1 is referred to.

The sense amplifier 103 in FIG. 3 includes, for example, an operational amplifier 131. As described in Embodiment 1, the output voltage Vout is supplied to a non-inversion input terminal of the operational amplifier 131, and a reference voltage Vref for determining the output voltage Vout is supplied to an inversion input terminal. The operational amplifier 131 outputs a determination signal Sout which is switched between H level and L level in accordance with the relationship between the output voltage Vout and the reference voltage Vref.

Next, the elements in the reference voltage generation circuit 104 will be described. The reference voltage generation circuit 104 illustrated in FIG. 3 includes a transistor 141, a transistor 142, a transistor 143, a voltage source 144, and a standard voltage generation circuit 145.

A selection signal Ref_SEL for reference is input to a gate of the transistor 141, and a standard voltage corresponding to multilevel data is supplied to one of a source and a drain of the transistor 141 from the standard voltage generation circuit 145. When the transistor 141 is on, the standard voltage is supplied to a node Node_ref which is any node on a wiring that makes a connection between the other of the source and the drain of the transistor 141 and a gate of the transistor 142. Note that the transistor 141 is equivalent to the aforementioned transistor 111. That is, the transistor 141 has low off-state current, and when the transistor 141 is turned off, the node Node_ref is brought into an electrically floating state.

The potential of the node Node_ref is supplied to the gate of the transistor 142, and a high power source potential Vd is supplied to one of a source and a drain of the transistor 142. The other of the source and the drain of the transistor 142 is connected to one of a source and a drain of the transistor 143. Note that the transistor 142 is equivalent to the aforementioned transistor 112. That is, the transistor 142 is used for reading a voltage retained in the node Node_ref.

The potential of the voltage source 144 is supplied to a gate of the transistor 143, and a low power source potential Vs is supplied to the other of the source and the drain of the transistor 143. Note that the transistor 143 is equivalent to the aforementioned transistor 121. That is, a current Id_i flows through the transistor 143 in accordance with a voltage Vgs_i applied from the voltage source 144.

The voltage source 144 is provided to apply a voltage between the gate and the source of the transistor 143. The voltage applied from the voltage source 144 is determined to be equal to the voltage Vgs_i supplied from the voltage source 122 in the reference current generation circuit 102. In that case, the same current Id_i flows through the transistor 143 and the transistor 121.

The standard voltage generation circuit 145 may be composed of a resistor ladder that generates voltages with plural levels, for example. In the case where N-level data is stored in the memory cell 101 (N is a natural number of two or more), the standard voltage generation circuit 145 produces standard voltages with (N−1) levels. The voltage level of each standard voltage is a medium level of the voltage levels to be the aforementioned N-level data. Any standard voltage that has been selected is retained in the node Node_ref. Then, a voltage corresponding to the voltage retained in the node Node_ref is output as the reference voltage Vref to the other of the source and the drain of the transistor 141 as in the transistor 112 in the memory cell 101.

Figure 4A:
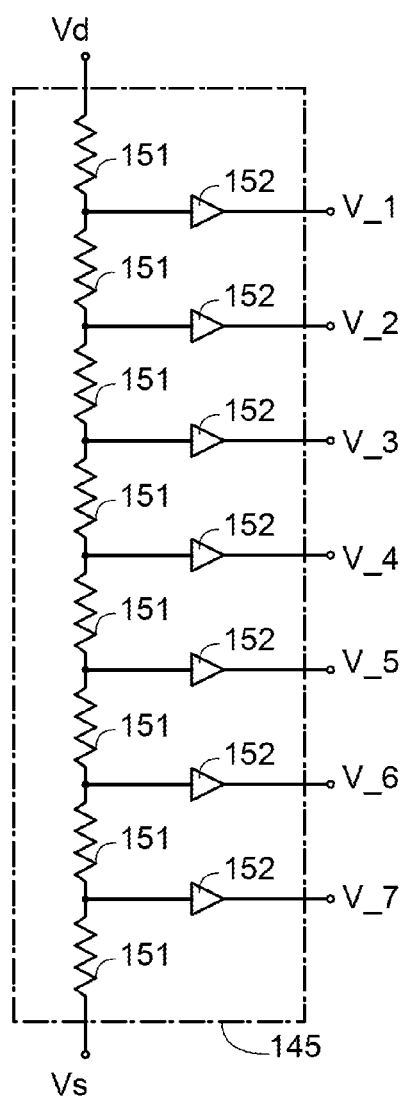
FIG. 4A is a circuit diagram of a reference voltage generation circuit and FIG. 4B shows the relationship between voltages in the reference voltage generation circuit.

FIG. 4A illustrates a specific example of a structure of the standard voltage generation circuit 145, which includes a plurality of resistors 151 and a plurality of buffer circuits 152.

The plurality of resistors 151 are electrically connected in series between a wiring supplied with the high power source potential Vd and a wiring supplied with the low power source potential Vs. A plurality of standard voltages with different levels are generated at nodes between the resistors 151 because of voltage division. Then, any one of the reference voltages is supplied to one of the source and the drain of the transistor 141 through the buffer circuit 152.

FIG. 4A shows standard voltages V_1 to V_7 as an example of a plurality of standard voltages produced in the standard voltage generation circuit 145.

In the reference voltage generation circuit 104, reference voltages Vref_1 to Vref_7 are generated using the aforementioned standard voltages V_1 to V_7. The reference voltage Vref can be produced similarly to the output voltage Vout in the memory cell 101 and the reference current generation circuit 102.

Specifically, the reference voltage Vref_x can be represented by Formula (9) where V_x denotes a standard voltage (x is any natural number) and Vth_ref denotes the threshold voltage of the transistor 142. Note that Formula (9) can be obtained by making Vgs_i−Vth_i of the transistor 142 as small as possible like in the aforementioned Formula (5).

$$V\text{ref}\_x = V\_x - (Vth\_ref + Vb) \qquad (9)$$

The reference voltage Vref_x in Formula (9) includes voltage Vb produced depending on variation in the threshold voltage of the transistor 143. Note that Formula (9) does not include V(RS), the second term of the right side in Formula (5). The voltage (V(RS)) based on the read signal (RS) may be added to the reference voltage V_x in advance.

Figure 4B:
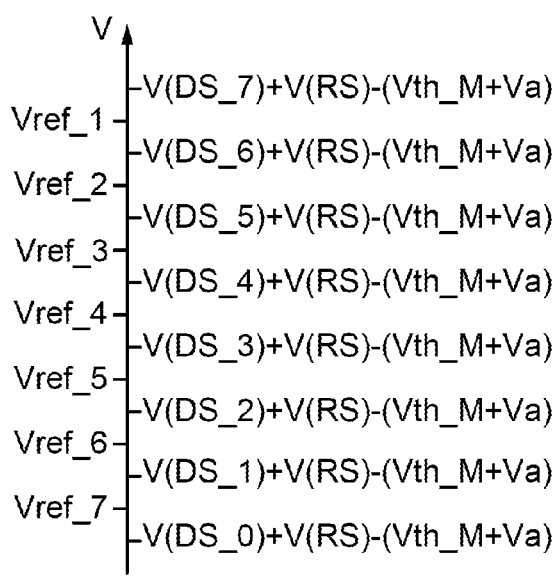

FIG. 4B shows the relationship between the reference voltages Vref_1 to Vref_7 and the output voltages (V(DS_7 to DS_0)+V(RS)−(Vth_M+Va)) corresponding to, for example, 3-bit data. The levels of these voltages are determined in the sense amplifier 103 so that multilevel data stored in the memory cell can be obtained.

The structure described in this embodiment can be combined as appropriate with any of the structures described in the other embodiments.

Embodiment 3

In this embodiment, structure examples of peripheral circuits including the memory cell, the reference current generation circuit, the sense amplifier, and the reference voltage generation circuit, which are shown in Embodiments 1 and 2, will be described with reference to FIG. 5. Also in this embodiment, a timing chart of multilevel data read from a plurality of memory cells arranged in the column direction will be described with reference to FIG. 6 and FIG. 7.

Figure 5:
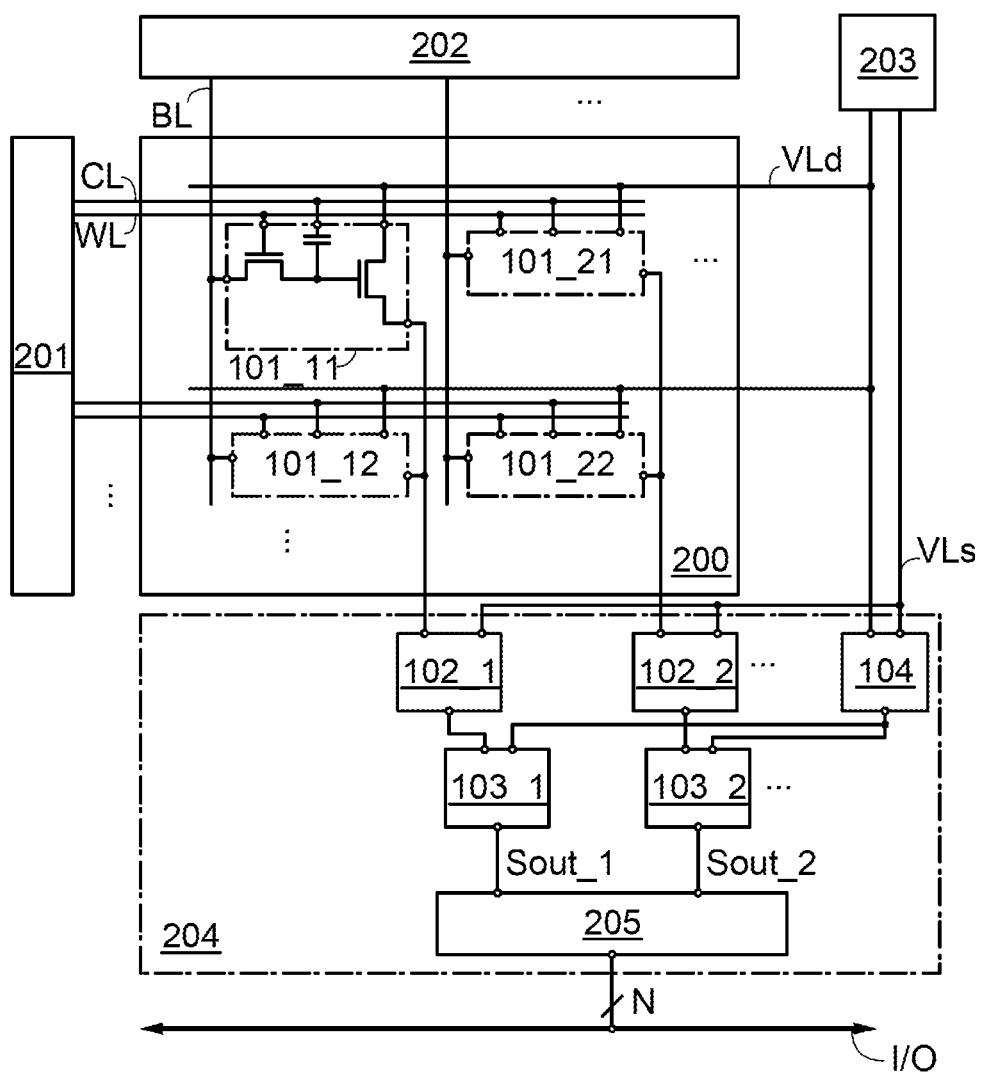
FIG. 5 is a circuit diagram of a memory cell.

The circuit block diagram illustrated in FIG. 5 includes a memory circuit portion 200 provided with m×n memory cells 101 (in the drawing, the memory cell in the m-th row and the n-th column is denoted as a memory cell 101_mn), a driver circuit 201 and a driver circuit 202 which supply each wiring with a signal controlling the memory cells, a power source circuit 203 generating a plurality of potentials, a data reading circuit portion 204, an arithmetic circuit 205, and an input/output portion I/O.

In the memory circuit portion 200, a memory cell 101_11, a memory cell 101_12, a memory cell 101_21, and a memory cell 101_22 are illustrated as examples. Each of the memory cells is connected to a bit line BL, a read line CL, a word line WL, and a high power source potential line VLd. The power source circuit 203, which produces a potential supplied to the high power source potential line VLd connected to each memory cell, is connected to a low power source potential line VLs.

The bit line BL is supplied with multilevel data DS. The word line WL is supplied with a word signal WS. The read line CL is supplied with a read signal RS. The high power source potential line VLd is supplied with a high power source potential Vd. The low power source potential line VLs is supplied with a low power source potential Vs.

The driver circuit 201 controls the read signal RS and the word signal WS input to the read line CL and the word line WL, respectively. A shift register and the like may be used for the driver circuit 201. The driver circuit 202 controls multi-level data input to the bit line BL.

The power source circuit 203 generates the high power source potential Vd and the low power source potential Vs supplied to the high power source potential line VLd and the low power source potential line VLs, respectively.

The data reading circuit portion 204 includes reference current generation circuits 102_1 to 102_n provided for the respective columns of memory cells, the reference voltage generation circuit 104, sense amplifiers 103_1 to 103_n corresponding to the reference current generation circuits 102_1 to 102_n, and an arithmetic circuit 205.

Each of the reference current generation circuits 102_1 to 102_n is equivalent to the reference current generation circuit 102 shown in FIG. 1. The reference current generation circuits 102_1 to 102_n produce a reference current for reading multilevel data from the memory cells provided in the corresponding columns, and supply an output voltage Vout to the sense amplifiers 103_1 to 103_n.

The reference voltage generation circuit 104 is equivalent to the reference voltage generation circuit 104 shown in FIG. 3. In the case where N-level data is stored in the memory cells, the reference voltage generation circuit 104 produces reference voltages with (N−1) levels.

A plurality of reference voltage generation circuits 104 may be provided. In that case, the standard voltage generation circuits 145 included in the respective reference voltage generation circuits 104 may output different standard voltages. The reference voltage generation circuits 104 supply reference voltages with (N−1) levels to the sense amplifiers 103_1 to 103_n.

Each of the sense amplifiers 103_1 to 103_n is equivalent to the sense amplifier 103 shown in FIG. 3. In the sense amplifiers 103_1 to 103_n, the level of the output voltage Vout is determined by the comparison between the output voltage Vout from the reference current generation circuits 102_1 to 102_n provided for the respective columns and the reference voltage with any of (N−1) levels from the reference voltage generation circuit 104. Then, the determination results are output as determination signals Sout_1 to Sout_n to the arithmetic circuit 205.

In the arithmetic circuit 205, arithmetic operation is performed on the basis of the determination signals Sout_1 to Sout_n, and $2^N$-level data read from the memory cell is output as N-bit data to the input/output portion I/O.

Figure 6:
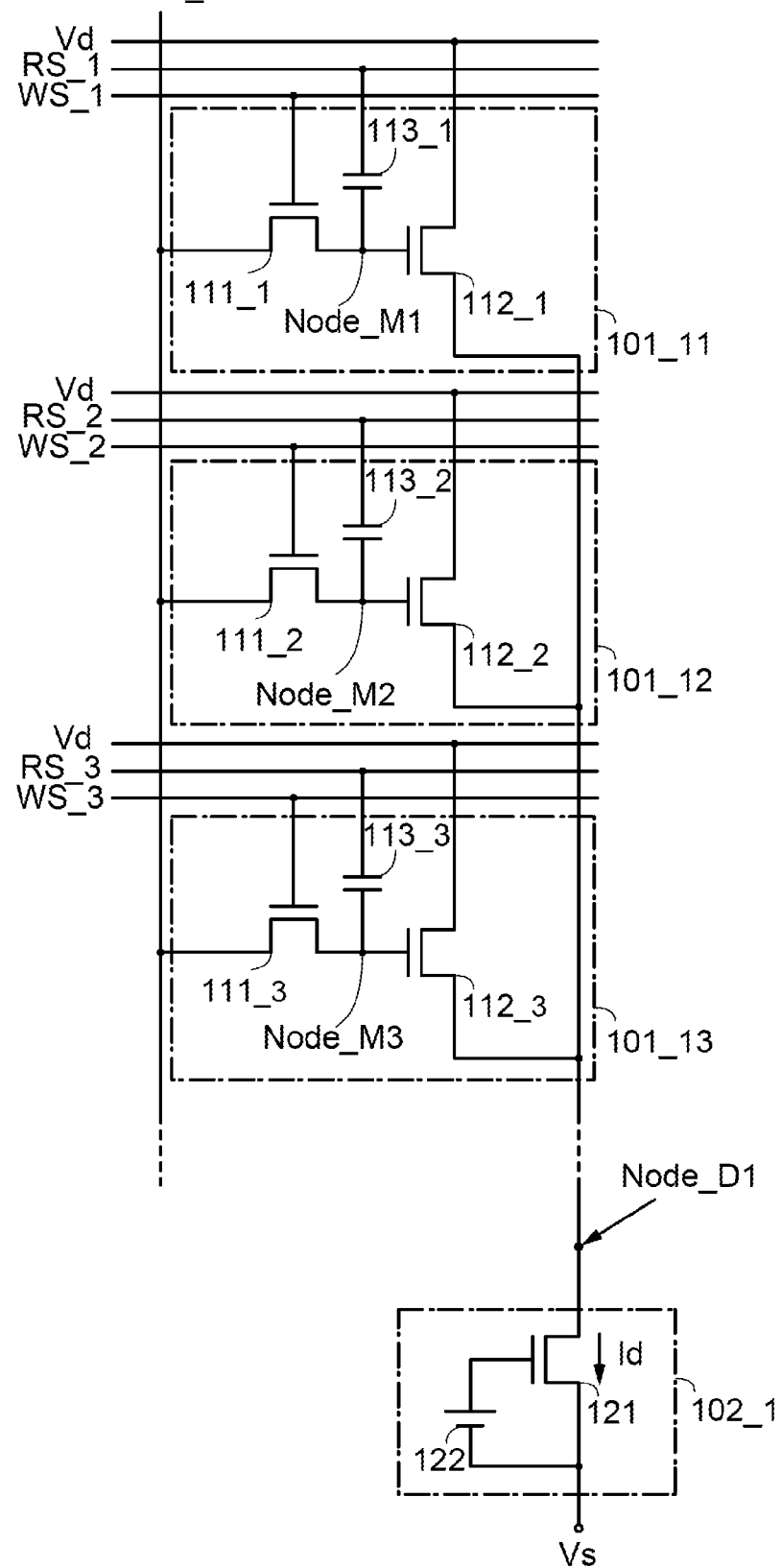
FIG. 6 is a circuit block diagram of a semiconductor device.

FIG. 6 illustrates, as an example, the memory cell 101_11, the memory cell 101_12, and a memory cell 101_13 in the first column of the memory circuit portion 200 illustrated in FIG. 5, and the reference current generation circuit 102_1. Note that transistors 111_1 to 111_3 included in the memory cells 101_11 to 101_13 are each equivalent to the transistor 111 shown in FIG. 1. Transistors 112_1 to 112_3 included in the memory cells 101_11 to 101_13 are each equivalent to the transistor 112 shown in FIG. 1. Capacitors 113_1 to 113_3 included in the memory cells 101_11 to 101_13 are each equivalent to the capacitor 113 shown in FIG. 1.

The high power source potential Vd is input to each element in the memory cell 101_11 from the high power source potential line VLd. A read signal RS_1 is input to the memory cell 101_11 from any one of the read lines CL. A word signal WS_1 is input to the memory cell 101_11 from any one of the word lines WL. Data DS_1 is input to the memory cell 101_11 from any one of the bit lines BL. A node Node_M1 in the memory cell 101_11 is equivalent to the node Node_M shown in FIG. 1.

Similarly, the high power source potential Vd is input to each element in the memory cell 101_12 from the high power source potential line VLd. A read signal RS_2 is input to the memory cell 101_12 from any one of the read lines CL. A word signal WS_2 is input to the memory cell 101_12 from any one of the word lines WL. The data DS_1 is input to the memory cell 101_12 from any one of the bit lines BL. A node Node_M2 in the memory cell 101_12 is equivalent to the node Node_M shown in FIG. 1.

Similarly, the high power source potential Vd is input to each element in the memory cell 101_13 from the high power source potential line VLd. A read signal RS_3 is input to the memory cell 101_13 from any one of the read lines CL. A word signal WS_3 is input to the memory cell 101_13 from any one of the word lines WL. The data DS_1 is input to the memory cell 101_13 from any one of the bit lines BL. A node Node_M3 in the memory cell 101_13 is equivalent to the node Node_M shown in FIG. 1.

The other node of a source and a drain of each of the transistors 112_1 to 112_3 included in the memory cells 101_11 to 101_13 is connected to one another. This node is referred to as a node Node_D1 and supplied with the output voltage Vout.

The reference current generation circuit 102_1 is equivalent to the reference current generation circuit 102 shown in FIG. 1. The reference current generation circuit 102_1 in FIG. 6 includes the transistor 121 and the voltage source 122.

Next, a timing chart of data written to and read from the memory cells 101_11 to 101_13 illustrated in FIG. 6 will be described with reference to FIG. 7.

Figure 7:
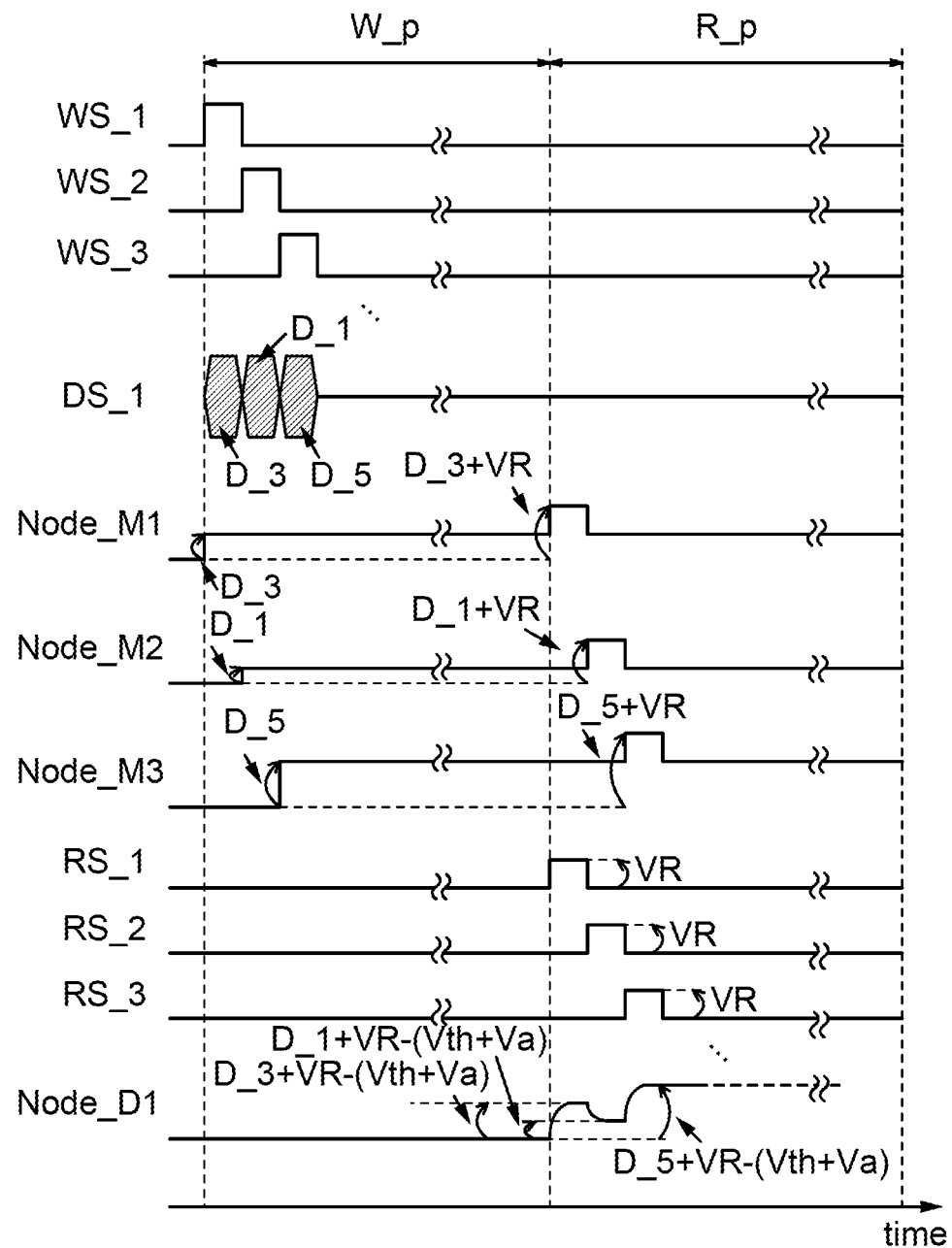
FIG. 7 is a timing chart of a semiconductor device.

In the timing chart of FIG. 7, W_p denotes a data writing period and R_p denotes a data reading period. FIG. 7 shows changes in the word signals WS_1 to WS_3, the data DS_1, the voltages of the nodes Node_M1 to Node_M3, the read signals RS_1 to RS_3, and the voltages of the node Node_D1.

In the period W_p in FIG. 7, first, the word signals WS_1 to WS_3 are set to H level so that multilevel data of the data DS_1 is written to the nodes Node_M1 to Node_M3 in the respective memory cells. The written data DS_1 is the multilevel data as mentioned above.

Note that in FIG. 7, data written to the node Node_M1 is denoted as D_3, data written to the node Node_M2 is denoted as D_1, and data written to the node Node_M3 is denoted as D_5. The relationship between the voltages of the data is D_1<D_3<D_5. In FIG. 7, an increase in the voltage of each of the nodes Node_M1 to Node_M3 is represented by the corresponding voltage level.

In the period W_p, the read signals RS_1 to RS_3 and the node Node_D1 do not change.

In the period R_p in FIG. 7, first, the read signals RS_1 to RS_3 are sequentially increased by voltage VR, whereby the voltages of the nodes Node_M1 to Node_M3 are increased from D_3, D_1, and D_5 to (D_3+VR), (D_1+VR), and (D_5+VR), respectively.

Here, the voltage between the gate and the source of each of the transistors 112_1 to 112_3 is maintained to satisfy the relationship of Formula (3). Therefore, the voltage of the node Node_D1, which is equal to the gate-source voltage of each of the transistors 112_1 to 112_3, changes to satisfy the relationship of Formula (5). In other words, the voltage of the node Node_D1 changes in accordance with a change in the data D_3, D_1, and D_5; as a result, the output voltage can be obtained.

An increase in the voltages of the nodes Node_M1 to Node_M3 makes it possible to keep the gate-source voltage of the transistors 112_1 to 112_3 in the memory cells 101_11 to 101_13. Hence, the voltage of the node Node_D1 corresponding to the other of the source and the drain, changes.

Specifically, in the case where the data D_3 is read from the memory cell 101_11, the node Node_D1 has a voltage of D_3+VR−(Vth_M+Va). In the case where the data D_1 is read from the memory cell 101_12, the node Node_D1 has a voltage of D_1+VR−(Vth_M+Va). In the case where the data D_5 is read from the memory cell 101_13, the node Node_D1 has a voltage of D_5+VR−(Vth_M+Va).

In the operation of the semiconductor device described in this embodiment, a voltage corresponding to data that is less influenced by variation in the characteristics of transistors can be read as an output voltage from a memory cell. As a result, multilevel data to be written to the memory cell can have a larger number of bits.

The structure described in this embodiment can be combined as appropriate with any of the structures described in the other embodiments.

Embodiment 4

In this embodiment, modified examples of the elements in the semiconductor devices shown in Embodiments 1 to 3 will be described with reference to FIG. 8 to FIG. 11.

Modified examples of the semiconductor device including the memory cell and the reference current generation circuit will be described with reference to FIG. 8 to FIG. 11.

Figure 8:
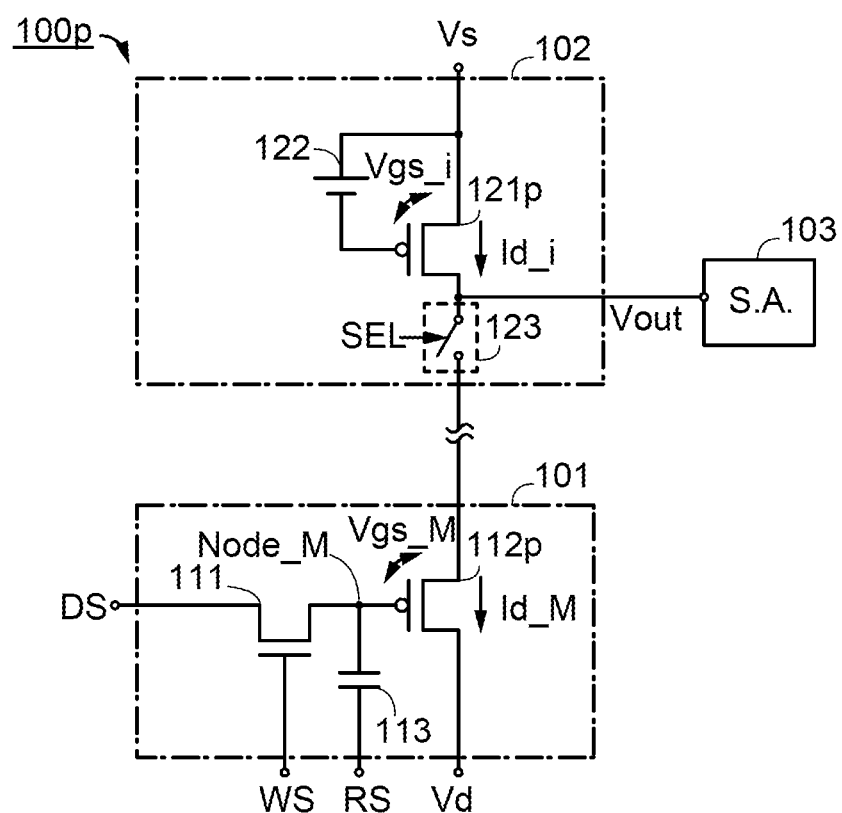
FIG. 8 is a circuit block diagram of a semiconductor device.

The circuit block diagram of a semiconductor device 100p illustrated in FIG. 8 includes the memory cell 101, the reference current generation circuit 102, and the sense amplifier 103. The memory cell 101 illustrated in FIG. 8 includes the transistor 111, a transistor 112p, and the capacitor 113. The reference current generation circuit 102 in FIG. 8 includes a transistor 121p, the voltage source 122, and the switch 123.

The semiconductor device 100p in FIG. 8 is different from the semiconductor device 100 in FIG. 1 in that the transistors 112p and 121p are p-channel transistors.

In the structure of the semiconductor device 100p in FIG. 8, the position of the source and the drain of the transistor is reversed from that in FIG. 1. However, as in the structure of FIG. 1, the transistor for reading data held in the gate can be used as a source follower transistor (common drain transistor), and a voltage applied to a transistor generating a reference current flowing through the memory cell can be determined so that a gate-source voltage is equal to the threshold voltage of the transistor.

In the structure of FIG. 8 as well as in the structure of FIG. 1, data stored in the memory cell can be read as a voltage that is less influenced by variation of transistors such as the field-effect mobility and the size.

Figure 9:
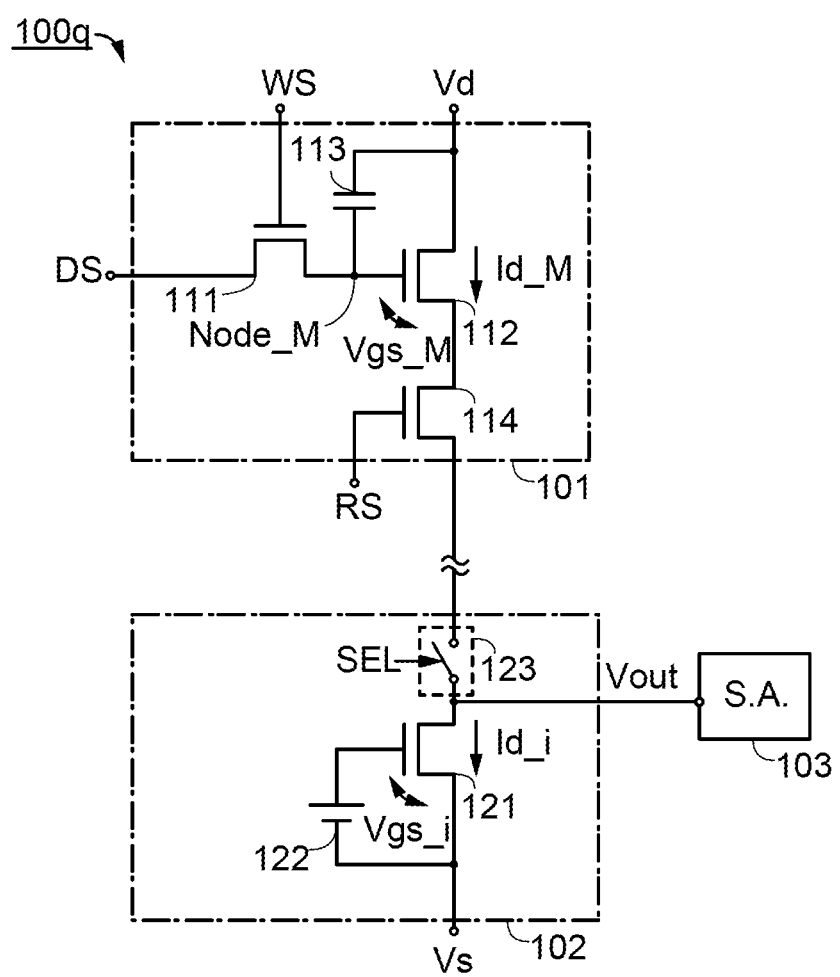
FIG. 9 is a circuit block diagram of a semiconductor device.

As another structure, the circuit block diagram of a semiconductor device 100q illustrated in FIG. 9 includes the memory cell 101, the reference current generation circuit 102, and the sense amplifier 103. The memory cell 101 illustrated in FIG. 9 includes the transistor 111, the transistor 112, the capacitor 113, and a transistor 114. The reference current generation circuit 102 in FIG. 9 includes the transistor 121, the voltage source 122, and the switch 123.

The semiconductor device 100q in FIG. 9 is different from the semiconductor device 100 in FIG. 1 in that the transistor 114 is added to the memory cell 101. The transistor 114 is also referred to as a fourth transistor.

In the structure of the semiconductor device 100q in FIG. 9, the output voltage Vout can be obtained with the read signal RS added to a gate of the transistor 114. Hence, in the structure of FIG. 9, the other electrode of the capacitor 113 can be connected to the high power source potential Vd which is fixed, and the amplitude voltage of the read signal RS can be increased, reducing the effect of variation of the transistor 114.

In the structure of FIG. 9, the number of transistors in the memory cell 101 increases. However, as in the structure of FIG. 1, the transistor for reading data held in the gate can be used as a source follower transistor (common drain transistor), and a voltage applied to a transistor generating a reference current flowing through the memory cell can be determined so that a gate-source voltage is equal to the threshold voltage of the transistor.

In the structure of FIG. 9 as well as in the structure of FIG. 1, data stored in the memory cell can be read as a voltage that is less influenced by variation of transistors such as the field-effect mobility and the size.

Figure 10:
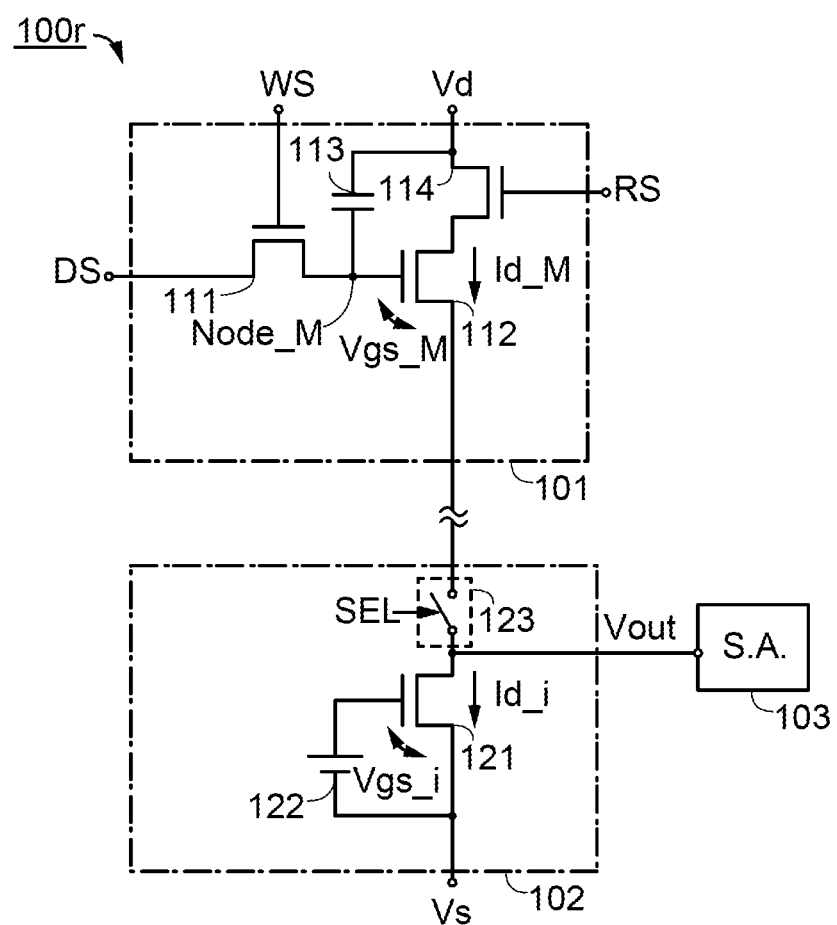
FIG. 10 is a circuit block diagram of a semiconductor device.

In the semiconductor device 100q illustrated in FIG. 9, the transistor 114 is provided on the side of the other of the source and the drain of the transistor 112; however, as in a semiconductor device 100r illustrated in FIG. 10, the transistor 114 may be provided on the side of one of the source and the drain of the transistor 112.

Figure 11:
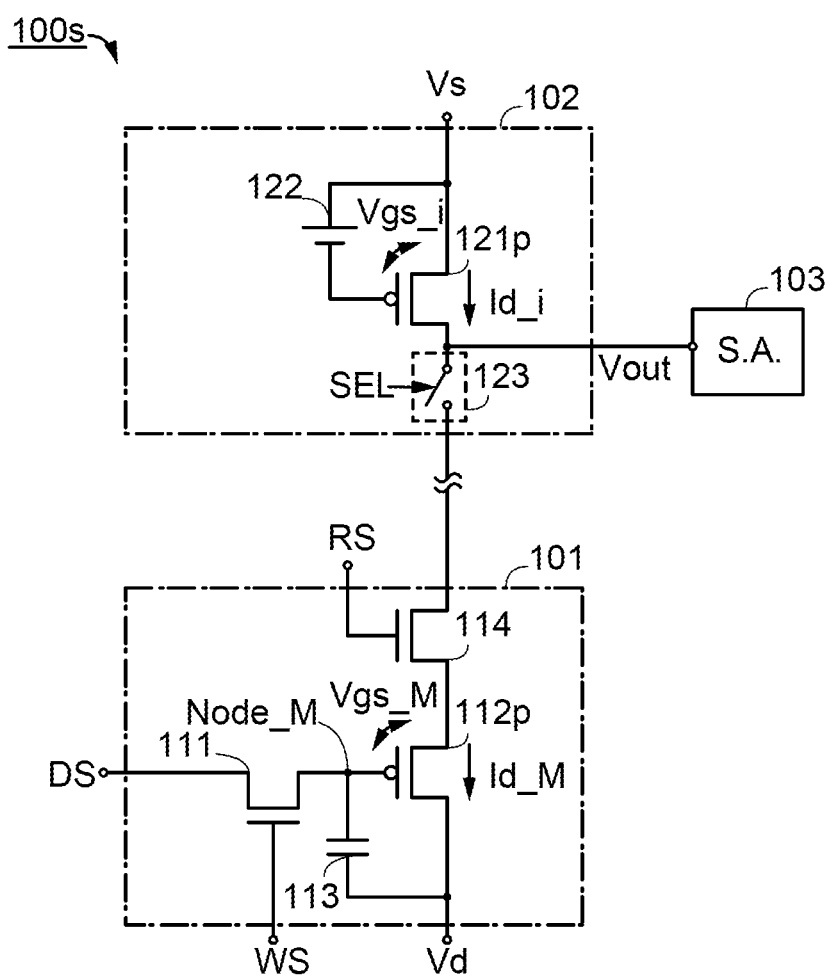
FIG. 11 is a circuit block diagram of a semiconductor device.

In the semiconductor device 100q illustrated in FIG. 9, the transistors 112 and 121 are n-channel transistors; however, as in a semiconductor device 100s illustrated in FIG. 11, p-channel transistors 112p and 121p may be employed.

The structure described in this embodiment can be combined as appropriate with any of the structures described in the other embodiments.

Embodiment 5

In this embodiment, an oxide semiconductor that can be used for the semiconductor layer of the transistor with a low off-state current described in the above embodiments will be described.

An oxide semiconductor used for a channel formation region in the semiconductor layer of the transistor preferably contains at least indium (In) or zinc (Zn). In particular, the oxide semiconductor preferably contains both In and Zn. A stabilizer for strongly bonding oxygen is preferably contained in addition to In and Zn. As the stabilizer, at least one of gallium (Ga), tin (Sn), zirconium (Zr), hafnium (Hf), and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor used for the semiconductor layer of the transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, it is possible to use an In—Ga—Zn-based oxide with an atomic ratio of In:Ga:Zn=1:1:1, In:Ga:Zn=3:1:2, or In:Ga:Zn=2:1:3, or an oxide with an atomic ratio close to the above atomic ratios.

When the oxide semiconductor film forming the semiconductor layer contains a large amount of hydrogen, the hydrogen and the oxide semiconductor are bonded to each other, so that part of the hydrogen serves as a donor to cause generation of an electron which is a carrier. As a result, the threshold voltage of the transistor shifts in the negative direction. Therefore, it is preferable that, after the formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. For that reason, it is preferable that oxygen be added to the oxide semiconductor film to fill oxygen vacancies in the oxide semiconductor film, which are produced by the dehydration treatment (dehydrogenation treatment). In this specification and the like, supplying oxygen to an oxide semiconductor film is expressed as oxygen adding treatment, and treatment for making the oxygen content of an oxide semiconductor film be in excess of that in the stoichiometric composition is expressed as treatment for making an oxygen-excess state in some cases.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) or substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

Thus, the transistor including an i-type or substantially i-type oxide semiconductor film can have extremely favorable off-state current characteristics. For example, the drain current at the time when the transistor including an oxide semiconductor film is in an off state can be less than or equal to $1\times10^{-18}$ A, preferably less than or equal to $1\times10^{-21}$ A, and more preferably less than or equal to $1\times10^{-24}$ A at room temperature (approximately 25° C.); or less than or equal to $1\times10^{-15}$ A, preferably less than or equal to $1\times10^{-18}$ A, and more preferably less than or equal to $1\times10^{-21}$ A at 85° C. Note that the off state of an n-channel transistor refers to a state where the gate voltage is sufficiently lower than the threshold voltage. Specifically, the transistor is in an off state when the gate voltage is lower than the threshold voltage by 1 V or more, 2 V or more, or 3 V or more.

An oxide semiconductor which is formed may include a non-single-crystal, for example. The non-single-crystal is, for example, structured by at least one of c-axis aligned crystal (CAAC), polycrystal, microcrystal, and an amorphous part.

An oxide semiconductor may include CAAC, for example. Note that an oxide semiconductor including CAAC is referred to as a CAAC-OS (c-axis aligned crystalline oxide semiconductor).

In an image obtained with a transmission electron microscope (TEM), for example, crystal parts can be found in the CAAC-OS in some cases. In most cases, in an image obtained with a TEM, crystal parts in the CAAC-OS each fit inside a cube whose one side is 100 nm, for example. In an image obtained with a TEM, a boundary between the crystal parts in the CAAC-OS is not clearly observed in some cases. Further, in an image obtained with a TEM, a grain boundary in the CAAC-OS is not clearly observed in some cases. In the CAAC-OS, since a clear grain boundary does not exist, for example, segregation of an impurity is unlikely to occur. In the CAAC-OS, since a clear grain boundary does not exist, for example, high density of defect states is unlikely to occur. In the CAAC-OS, since a clear grain boundary does not exist, for example, a reduction in electron mobility is unlikely to occur.

For example, the CAAC-OS includes a plurality of crystal parts. In the plurality of crystal parts, c-axes are aligned in a direction parallel to a normal vector of a surface where the CAAC-OS is formed or a normal vector of a surface of the CAAC-OS in some cases. When the CAAC-OS is analyzed by an out-of-plane method with an X-ray diffraction (XRD) apparatus, a peak at 2θ of around 31 degrees which shows alignment appears in some cases. Further, for example, spots (luminescent spots) are shown in an electron diffraction pattern of the CAAC-OS in some cases. An electron diffraction pattern obtained with an electron beam having a diameter of 10 nmϕ or smaller, or 5 nmϕ or smaller, is called a nanobeam electron diffraction pattern. In the CAAC-OS, for example, among crystal parts, the directions of the a-axis and the b-axis of one crystal part are different from those of another crystal part, in some cases. In the CAAC-OS, for example, c-axes are aligned, and a-axes and/or b-axes are not macroscopically aligned, in some cases.

In each of the crystal parts included in the CAAC-OS, for example, a c-axis is aligned in a direction parallel to a normal vector of a surface where the CAAC-OS is formed or a normal vector of a surface of the CAAC-OS, triangular or hexagonal atomic arrangement that is seen from the direction perpendicular to the a-b plane is formed, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

Further, the CAAC-OS can be formed by reducing the density of defect states for example. In an oxide semiconductor, for example, oxygen vacancies are defect states. The oxygen vacancies serve as trap levels or serve as carrier generation sources when hydrogen is trapped therein. In order to form the CAAC-OS, for example, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has low density of trap states in some cases. Thus, the transistor including the oxide semiconductor in the channel formation region has little variation in electrical characteristics and high reliability in some cases. A charge trapped by the trap states in the oxide semiconductor takes a long time to disappear. The trapped charge may behave like a fixed charge. Thus, the transistor which includes the oxide semiconductor having a high density of trap states in the channel formation region has unstable electrical characteristics in some cases.

A transistor using the highly purified intrinsic or substantially highly purified intrinsic CAAC-OS has little variation in the electrical characteristics due to irradiation with visible light or ultraviolet light.

An oxide semiconductor may include polycrystal, for example. Note that an oxide semiconductor including polycrystal is referred to as a polycrystalline oxide semiconductor. A polycrystalline oxide semiconductor includes a plurality of crystal grains.

An oxide semiconductor may include microcrystal, for example. Note that an oxide semiconductor including microcrystal is referred to as a microcrystalline oxide semiconductor.

In an image obtained with a TEM, for example, crystal parts cannot be found clearly in the microcrystalline oxide semiconductor in some cases. In most cases, the size of a crystal part included in the microcrystalline oxide semiconductor is greater than or equal to 1 nm and less than or equal to 100 nm, or greater than or equal to 1 nm and less than or equal to 10 nm, for example. A microcrystal with a size greater than or equal to 1 nm and less than or equal to 10 nm is specifically referred to as nanocrystal (nc), for example. An oxide semiconductor including nanocrystal is referred to as a nanocrystalline oxide semiconductor (nc-OS). In an image of the nc-OS obtained with a TEM, for example, a boundary between crystal parts is not clearly detected in some cases. In an image of the nc-OS obtained with a TEM, for example, since a clear grain boundary does not exist, for example, segregation of an impurity is unlikely to occur. In the nc-OS, since a clear grain boundary does not exist, for example, high density of defect states is unlikely to occur. In the nc-OS, since a clear grain boundary does not exist, for example, a reduction in electron mobility is unlikely to occur.

In the nc-OS, for example, a microscopic region (for example, a region with a size greater than or equal to 1 nm and less than or equal to 10 nm) has a periodic atomic order occasionally. Further, for example, in the nc-OS, crystal parts are not regularly-arranged. Thus, there is a case where periodic atomic order is not observed microscopically or a case where long-range order in atomic arrangement is not observed. Accordingly, in some cases, the nc-OS cannot be distinguished from an amorphous oxide semiconductor, for example, depending on an analysis method. When the nc-OS is analyzed by an out-of-plane method with an XRD apparatus using an X-ray having a beam diameter larger than the diameter of a crystal part, a peak which shows alignment does not appear in some cases. Further, for example, a halo pattern is shown in some cases in an electron diffraction pattern of the nc-OS obtained by using an electron beam having a diameter larger than the diameter of a crystal part (for example, a beam diameter of 20 nm$\phi$ or more, or 50 nm$\phi$ or more). For example, spots are shown in some cases in a nanobeam electron diffraction pattern of the nc-OS obtained by using an electron beam having a diameter smaller than or equal to the diameter of a crystal part (for example, a beam diameter of 10 nm$\phi$ or less, or 5 nm$\phi$ or less). In a nanobeam electron diffraction pattern of the nc-OS, for example, regions with high luminance in a circular pattern are shown in some cases. In a nanobeam electron diffraction pattern of the nc-OS, for example, a plurality of spots are shown in the region in some cases.

Since the microscopic region in the nc-OS has a periodic atomic order occasionally, the nc-OS has lower density of defect states than the amorphous oxide semiconductor. Note that since crystal parts in the nc-OS are not regularly-arranged, the nc-OS has higher density of defect states than the CAAC-OS.

Note that the oxide semiconductor may be a mixed film including two or more of a CAAC-OS, a polycrystalline oxide semiconductor, a microcrystalline oxide semiconductor, and an amorphous oxide semiconductor. The mixed film includes two or more of an amorphous oxide semiconductor region, a microcrystalline oxide semiconductor region, a polycrystalline oxide semiconductor region, and a CAAC-OS region in some cases. The mixed film has a stacked-layer structure of two or more of an amorphous oxide semiconductor region, a microcrystalline oxide semiconductor region, a polycrystalline oxide semiconductor region, and a CAAC-OS region in some cases.

This embodiment can be implemented in appropriate combination with any of the other embodiments.

Embodiment 6

In this embodiment, a cross-sectional structure of a transistor included in a memory cell of a semiconductor device of one embodiment of the disclosed invention will be described with reference to drawings.

Figure 12:
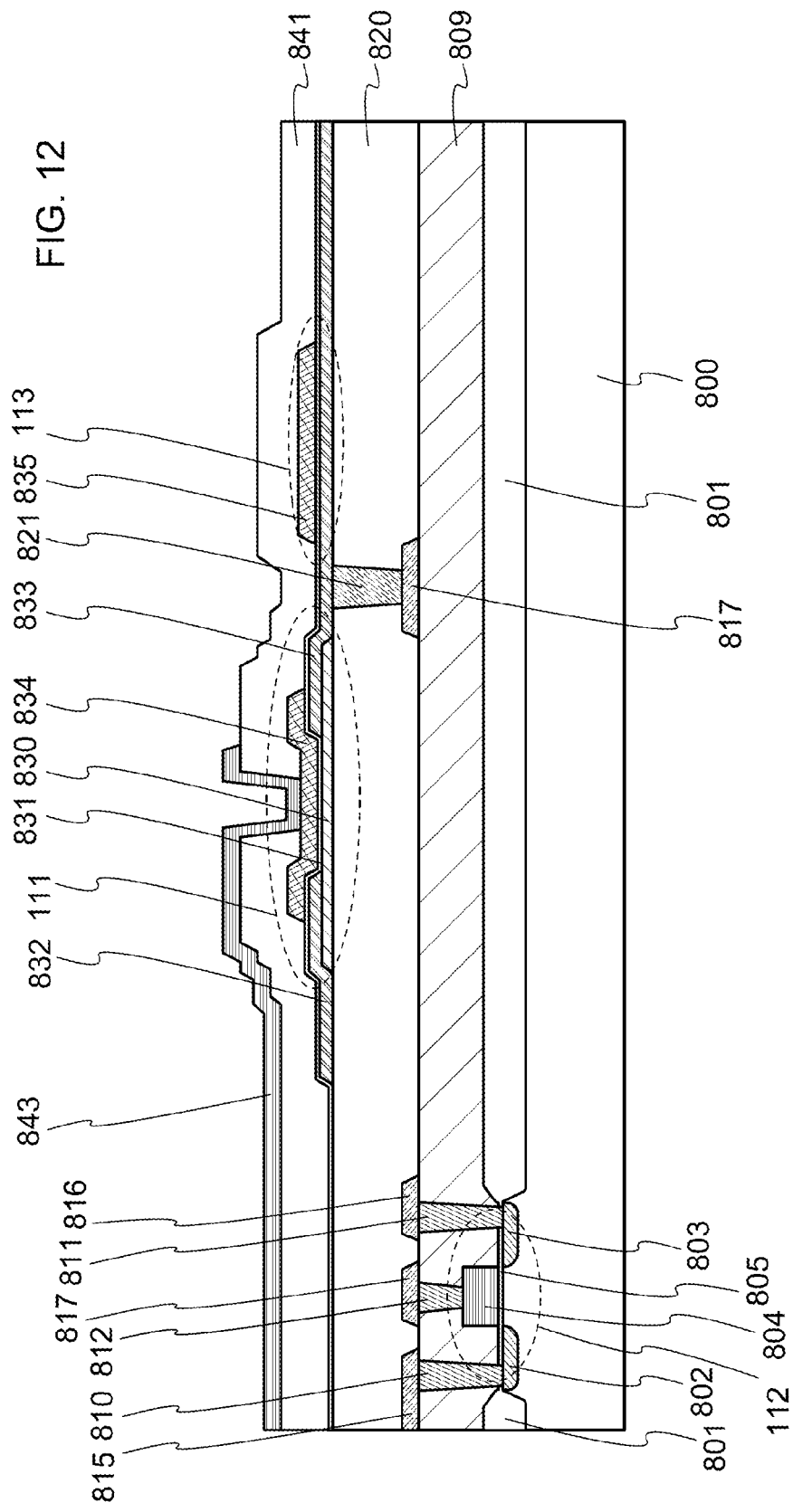
FIG. 12 is a cross-sectional view of a semiconductor device.

FIG. 12 illustrates an example of part of the cross-sectional structure of the memory cell of one embodiment of the present invention. FIG. 12 illustrates the transistor 111, the transistor 112, and the capacitor 113 shown in Embodiment 1.

In this embodiment, the transistor 112 is formed in a single crystal silicon substrate, and the transistor 111 including an oxide semiconductor layer is formed over the transistor 112. The transistor 112 may include a thin semiconductor layer of silicon, germanium, or the like in an amorphous, microcrystalline, polycrystalline, or signal crystal state.

In the case where the transistor 112 is formed using a thin silicon film, it is possible to use any of the following: amorphous silicon formed by a sputtering method or a vapor phase growth method such as a plasma CVD method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

Among the transistors included in the memory cell of the semiconductor device described in Embodiment 1, the transistor 111 includes an oxide semiconductor and the other transistors such as the transistors 112 and 121 include silicon. In that case, the number of transistors using an oxide semiconductor is smaller than that of transistors using silicon. Thus, a stack of the transistor 111 over the transistors using silicon leads to more flexible design rule of the transistor 111.

The chip area of a semiconductor device can be reduced by using such a structure in which a transistor including silicon and a transistor including an oxide semiconductor are stacked. Since the number of transistors including silicon is larger than that of transistors including an oxide semiconductor in one circuit block, the actual chip area of the semiconductor device depends on the number of transistors including silicon.

In FIG. 12, the n-channel transistor 112 is formed in a semiconductor substrate 800.

The semiconductor substrate 800 can be, for example, an n-type or p-type silicon substrate, germanium substrate, silicon germanium substrate, or compound semiconductor substrate (e.g., GaAs substrate, InP substrate, GaN substrate, SiC substrate, GaP substrate, GaInAsP substrate, or ZnSe substrate). FIG. 12 shows an example of using a single crystal silicon substrate having n-type conductivity.

The transistor 112 is electrically isolated from another transistor by an element isolation insulating film 801. The element isolation insulating film 801 can be formed by a local oxidation of silicon (LOCOS) method, a trench isolation method, or the like.

Specifically, the transistor 112 includes impurity regions 802 and 803 that are formed in the semiconductor substrate 800 and function as a source region and a drain region, a gate electrode 804, and a gate insulating film 805 provided between the semiconductor substrate 800 and the gate electrode 804. The gate electrode 804 overlaps with a channel formation region formed between the impurity regions 802 and 803 with the gate insulating film 805 positioned between the gate electrode 804 and the channel formation region.

An insulating film 809 is provided over the transistor 112. Openings are formed in the insulating film 809. Wirings 810 and 811 that are in contact with the impurity regions 802 and 803, respectively, and a wiring 812 that is in contact with the gate electrode 804 are formed in the openings.

The wiring 810 is connected to a wiring 815 formed over the insulating film 809. The wiring 811 is connected to a wiring 816 formed over the insulating film 809. The wiring 812 is connected to a wiring 817 formed over the insulating film 809.

An insulating film 820 is formed over the wirings 815 to 817. An opening is formed in the insulating film 820. In the opening, a wiring 821 that is connected to the wiring 817 is formed.

In FIG. 12, the transistor 111 and the capacitor 113 are formed over the insulating film 820.

The transistor 111 includes, over the insulating film 820, a semiconductor film 830 including an oxide semiconductor, conductive films 832 and 833 that are positioned over the semiconductor film 830 and function as a source electrode and a drain electrode, a gate insulating film 831 over the semiconductor film 830 and the conductive films 832 and 833, and a gate electrode 834 that is positioned over the gate insulating film 831 and overlaps with the semiconductor film 830 between the conductive films 832 and 833. Note that the conductive film 833 is connected to the wiring 821.

A conductive film 835 is provided over the conductive film 833 with the gate insulating film 831 positioned therebetween. A portion where the conductive films 833 and 835 overlap with each other with the gate insulating film 831 positioned therebetween functions as the capacitor 113.

Note that in FIG. 12, the capacitor 113 is provided over the insulating film 820 together with the transistor 111. However, the capacitor 113 may be provided below the insulating film 820 together with the transistor 112.

An insulating film 841 is provided over the transistor 111 and the capacitor 113. An opening is provided in the insulating film 841. Over the insulating film 841, a conductive film 843 that is in contact with the gate electrode 834 through the opening is provided.

Note that in FIG. 12, the transistor 111 includes the gate electrode 834 on at least one side of the semiconductor film 830. Alternatively, the transistor 111 may include a pair of gate electrodes with the semiconductor film 830 positioned therebetween.

When the transistor 111 includes a pair of gate electrodes with the semiconductor film 830 positioned therebetween, a signal for controlling on/off may be supplied to one of the gate electrodes, and the other of the gate electrodes may be supplied with a potential from another element. In the latter case, potentials at the same level may be supplied to the pair of electrodes, or a fixed potential such as a ground potential may be supplied only to the other of the gate electrodes. By controlling the level of a potential applied to the other of the gate electrodes, the threshold voltage of the transistor 111 can be controlled.

Figure 13A:
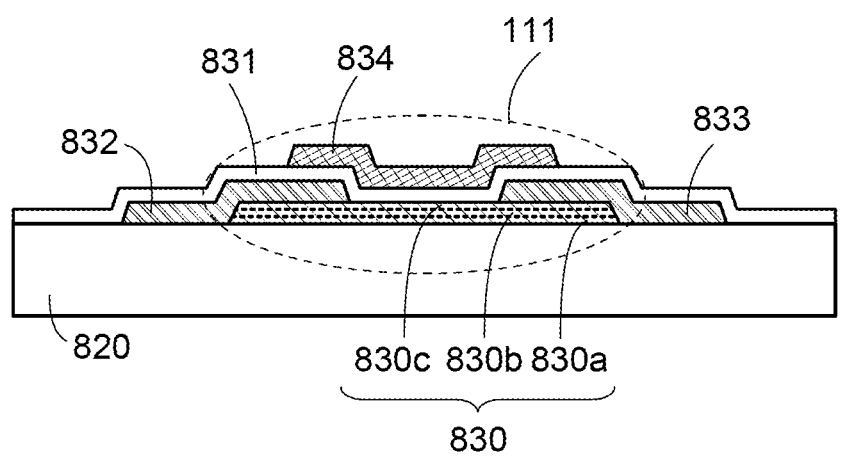
FIGS. 13A and 13B are cross-sectional views of a transistor.

The semiconductor film 830 is not necessarily a single oxide semiconductor film, but may be a stack of a plurality of oxide semiconductor films. FIG. 13A illustrates an example in which the semiconductor film 830 is formed using a stack of three oxide semiconductor films.

The transistor 111 in FIG. 13A includes the semiconductor film 830 provided over the insulating film 820 and the like, the conductive films 832 and 833 electrically connected to the semiconductor film 830, the gate insulating film 831, and the gate electrode 834 that is provided over the semiconductor film 830 with the gate insulating film 831 positioned therebetween.

As the semiconductor film 830 in the transistor 111, oxide semiconductor layers 830a to 830c are stacked sequentially from the insulating film 820 side.

Each of the oxide semiconductor layers 830a and 830c is an oxide film that contains at least one of metal elements contained in the oxide semiconductor layer 830b and in which energy at the bottom of the conduction band is closer to the vacuum level than that in the oxide semiconductor layer 830b by higher than or equal to 0.05 eV, 0.07 eV, 0.1 eV, or 0.15 eV and lower than or equal to 2 eV, 1 eV, 0.5 eV, or 0.4 eV. The oxide semiconductor layer 830b preferably contains at least indium because carrier mobility is increased.

Figure 13B:
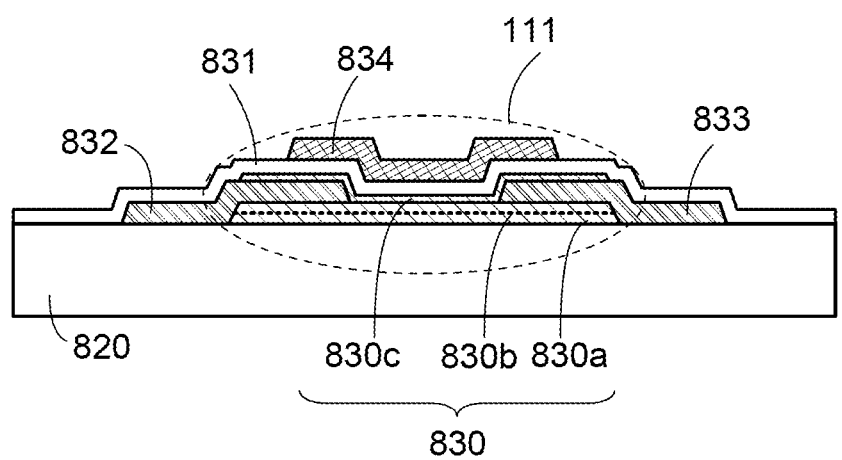

Note that as illustrated in FIG. 13B, the oxide semiconductor layer 830c may be provided over the conductive films 832 and 833 to overlap with the gate insulating film 831.

This embodiment can be implemented in appropriate combination with any of the other embodiments.

Embodiment 7

In this embodiment, application examples of the semiconductor device described in the above embodiments to an electronic component and to an electronic device including the electronic component will be described with reference to FIGS. 14A and 14B and FIGS. 15A to 15E.

Figure 14A:
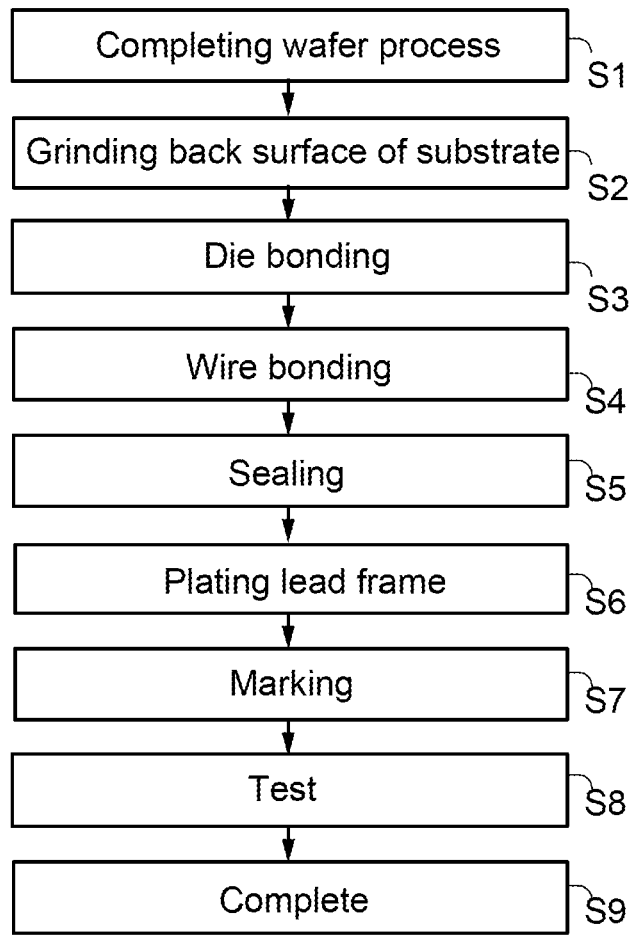
FIG. 14A is a flowchart showing manufacturing steps of a semiconductor device and FIG. 14B is a perspective schematic view of the semiconductor device.

FIG. 14A shows an example where the semiconductor device described in the above embodiments is used to make an electronic component. Note that the electronic component is also referred to as semiconductor package or IC package. For the electronic component, there are various standards and names corresponding to the direction of terminals or the shape of terminals; hence, one example of the electronic component will be described in this embodiment.

A semiconductor device including the transistors illustrated in FIG. 12 in Embodiment 6 undergoes the assembly process (post-process) to be completed in combination with components detachable to a printed circuit board.

The post-process can be completed through steps shown in FIG. 14A. Specifically, after an element substrate obtained in the wafer process is completed (Step S1), a back surface of the substrate is ground (Step S2). The substrate is thinned in this step to reduce warpage or the like of the substrate in the wafer process and to reduce the size of the component itself.

A dicing step is performed to grind the back surface of the substrate to separate the substrate into a plurality of chips. Then, a die bonding step is performed so that separate chips are individually picked up to be mounted on and bonded to a lead frame (Step S3). To bond a chip and a lead frame in the die bonding step, a method such as resin bonding or tape-automated bonding is selected as appropriate depending on products. Note that in the die bonding step, a chip may be mounted on an interposer to be bonded.

Next, wiring bonding for electrically connecting a lead of the lead frame and an electrode on a chip through a metal wire is performed (Step S4). As the metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, so that the circuit portion and the wire embedded in the component can be protected from external mechanical force and deterioration of characteristics due to moisture or dust can be reduced.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component including the circuit portion provided with the semiconductor device is completed (Step S9).

The aforementioned electronic component includes the semiconductor device described in the above embodiments. It is thus possible to achieve an electronic component including a memory cell that is less influenced by variation in the characteristics of transistors and has an increased number of bits. The electronic component includes the semiconductor device provided with the memory cell that is less influenced by variation in the characteristics of transistors and has an increased number of bits, and accordingly has a reduced size, weight, or power consumption.

Figure 14B:
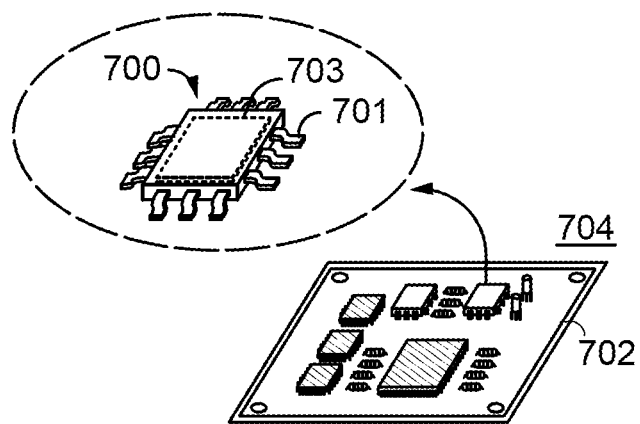

FIG. 14B is a perspective schematic view of a completed electronic component. FIG. 14B shows a perspective schematic view of a quad flat package (QFP) as an example of the electronic component. An electronic component 700 illustrated in FIG. 14B includes a lead 701 and a semiconductor device 703. The electronic component 700 in FIG. 14B is mounted on a printed wiring board 702, for example. The plurality of electronic components 700 are used in combination to be electrically connected to each other over the printed wiring board 702; thus, a circuit board on which the electronic components are mounted (a circuit board 704) is completed. The completed circuit board 704 is provided in an electronic device or the like.

Next, description is made on applications of the aforementioned electronic component to an electronic device such as a computer, a portable information terminal (including a cellular phone, a portable game machine, an audio reproducing device, and the like), electronic paper, a television device (also referred to as a television or a television receiver), or a digital video camera.

Figure 15A:
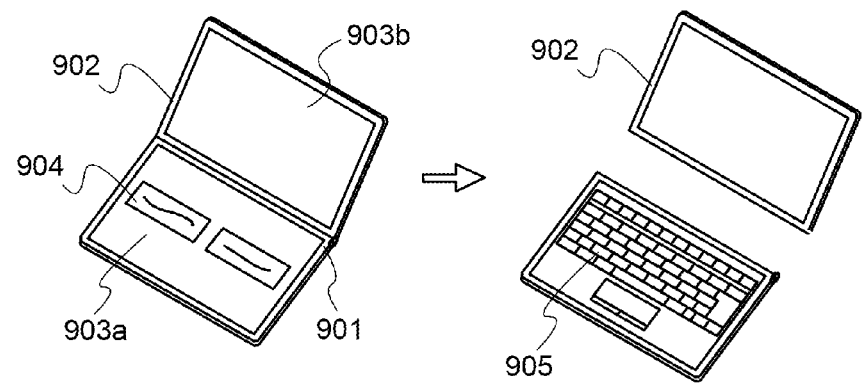
FIGS. 15A to 15E illustrate electronic devices each including a semiconductor device.

FIG. 15A illustrates a portable information terminal, which includes a housing 901, a housing 902, a first display portion 903a, a second display portion 903b, and the like. At least one of the housings 901 and 902 includes a circuit board including the semiconductor device described in the above embodiments. It is thus possible to achieve a portable information terminal which has a reduced size, weight, or power consumption.

Note that the first display portion 903a is a touch panel, and for example, as illustrated in the left of FIG. 15A, which of "touch input" and "keyboard input" is performed can be selected by a selection button 904 displayed on the first display portion 903a. Since the selection buttons with a variety of sizes can be displayed, the portable information terminal can be easily used by people of any generation. In the case where "keyboard input" is selected, for example, a keyboard 905 is displayed on the first display portion 903a as illustrated in the right of FIG. 15A. With the keyboard 905, letters can be input quickly by keyboard input as in the case of using a conventional information terminal, for example.

Further, one of the first display portion 903a and the second display portion 903b can be detached from the portable information terminal as illustrated in the right of FIG. 15A. When the first display portion 903a has a touch input function, the information terminal has a further reduced weight and thus is easy to carry, which is convenient because operation with one hand is enabled while the other hand supports the housing 902.

The portable information terminal illustrated in FIG. 15A can have a function of displaying various kinds of information (e.g., a still image, a moving image, and a text image), a function of displaying a calendar, a date, the time, or the like on the display portion, a function of operating or editing the information displayed on the display portion, a function of controlling processing by various kinds of software (programs), and the like. Further, an external connection terminal (e.g., an earphone terminal or a USB terminal), a recording medium insertion portion, and the like may be provided on the back surface or the side surface of the housing.

The portable information terminal illustrated in FIG. 15A may transmit and receive data wirelessly. Through wireless communication, desired book data or the like can be purchased and downloaded from an electronic book server.

Further, the housing 902 illustrated in FIG. 15A may have an antenna, a microphone function, or a wireless communication function to be used as a cellular phone.

Figure 15B:
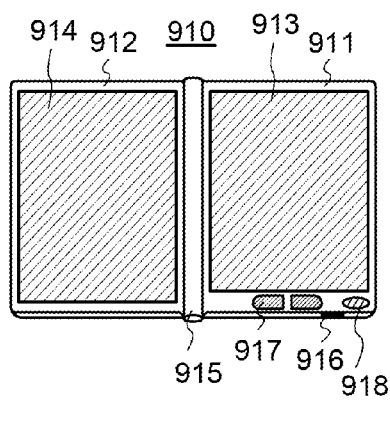

FIG. 15B illustrates an e-book reader 910 including electronic paper. The e-book reader 910 includes two housings 911 and 912. The housing 911 and the housing 912 include a display portion 913 and a display portion 914, respectively. The housings 911 and 912 are connected to each other by a hinge 915, so that the e-book reader 910 can be opened and closed using the hinge 915 as an axis. The housing 911 includes a power button 916, operation keys 917, a speaker 918, and the like. At least one of the housings 911 and 912 includes a circuit board including the semiconductor device described in the above embodiments. It is thus possible to achieve an e-book reader which has a reduced size, weight, or power consumption.

Figure 15C:
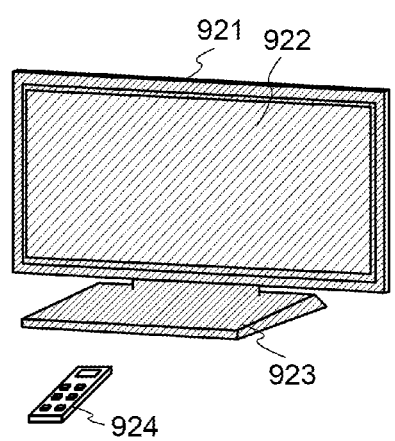

FIG. 15C is a television device, which includes a housing 921, a display portion 922, a stand 923, and the like. The television device 920 can be operated with a switch of the housing 921 and a remote control 924. The housing 921 and the remote control 924 include a circuit board including the semiconductor device described in the above embodiments. It is thus possible to achieve a television device which has a reduced size, weight, or power consumption.

Figure 15D:
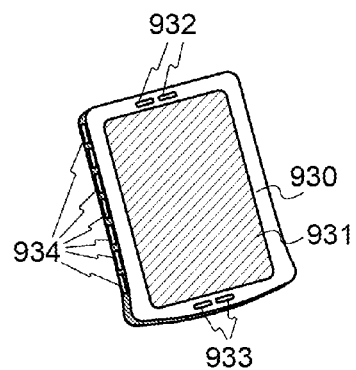

FIG. 15D illustrates a smartphone in which a main body 930 includes a display portion 931, a speaker 932, a microphone 933, operation buttons 934, and the like. The main body 930 includes a circuit board including the semiconductor device described in the above embodiments. It is thus possible to achieve a smartphone which has a reduced size, weight, or power consumption.

Figure 15E:
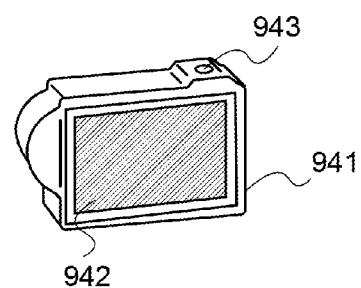

FIG. 15E illustrates a digital camera, which includes a main body 941, a display portion 942, an operation switch 943, and the like. The main body 941 includes a circuit board including the semiconductor device described in the above embodiments. It is thus possible to achieve a digital camera which has a reduced size, weight, or power consumption.

As described above, the electronic devices shown in this embodiment each include a circuit board including the semiconductor device of the above embodiments. It is thus possible to achieve electronic devices which have a reduced size, weight, or power consumption.

This application is based on Japanese Patent Application serial No. 2013-038326 filed with Japan Patent Office on Feb. 28, 2013, the entire contents of which are hereby incorporated by reference.

What is claimed is:

1. A semiconductor device comprising:
    a memory cell including a first transistor configured to write data and a second transistor configured to hold the data in a gate and read the data in accordance with a potential of the gate; and
    a reference current generation circuit including a third transistor configured to determine a current flowing between a source and a drain of the second transistor,
    wherein a voltage source is provided between a gate and a source of the third transistor, and
    wherein the second transistor is a common drain transistor.

2. The semiconductor device according to claim 1, wherein the memory cell comprises a fourth transistor supplied with a signal for reading the data.

3. The semiconductor device according to claim 1, wherein the memory cell is provided in a matrix.

4. The semiconductor device according to claim 1, wherein a semiconductor layer of the first transistor includes an oxide semiconductor.

5. An electronic device comprising an electronic component including the semiconductor device according to claim 1.

6. The electronic device according to claim 5, wherein the electronic device is one selected from the group consisting of a portable information terminal, an e-book reader, a television device, a smartphone, and a digital camera.

7. A semiconductor device comprising
    a memory cell including a first transistor configured to write data and a second transistor configured to hold the data in a gate and read the data in accordance with a potential of the gate; and
    a reference current generation circuit including a third transistor configured to determine a current flowing between a source and a drain of the second transistor,
    wherein the second transistor is a common drain transistor,
    wherein a voltage source is provided between a gate and a source of the third transistor, and
    wherein the reference current generation circuit determines a voltage applied between the gate and the source of the third transistor so as to be substantially equal to a threshold voltage of the third transistor, thereby determining the current.

8. The semiconductor device according to claim 7, wherein the memory cell comprises a fourth transistor supplied with a signal for reading the data.

9. The semiconductor device according to claim 7, wherein the memory cell is provided in a matrix.

10. The semiconductor device according to claim 7, wherein a semiconductor layer of the first transistor includes an oxide semiconductor.

11. An electronic device comprising an electronic component including the semiconductor device according to claim 7.

12. The electronic device according to claim 11, wherein the electronic device is one selected from the group consisting of a portable information terminal, an e-book reader, a television device, a smartphone, and a digital camera.

13. A semiconductor device comprising:
    a memory cell including a first transistor configured to write data, a second transistor configured to hold the data in a gate and read the data in accordance with a potential of the gate, and a capacitor electrically connected to the gate of the second transistor; and
    a reference current generation circuit including a third transistor configured to determine a current flowing between a source and a drain of the second transistor,
    wherein a voltage source is provided between a gate and a source of the third transistor, and
    wherein the second transistor is a common drain transistor.

14. The semiconductor device according to claim 13, wherein the memory cell comprises a fourth transistor supplied with a signal for reading the data.

15. The semiconductor device according to claim 13, wherein the capacitor is supplied with a signal for controlling reading of the data.

16. The semiconductor device according to claim 13, wherein the memory cell is provided in a matrix.

17. The semiconductor device according to claim 13, wherein a semiconductor layer of the first transistor includes an oxide semiconductor.

18. An electronic device comprising an electronic component including the semiconductor device according to claim 13.

19. The electronic device according to claim 18, wherein the electronic device is one selected from the group consisting of a portable information terminal, an e-book reader, a television device, a smartphone, and a digital camera.

* * * * *